(12) United States Patent
Raring et al.

(10) Patent No.: US 8,956,894 B2
(45) Date of Patent: *Feb. 17, 2015

(54) WHITE LIGHT DEVICES USING NON-POLAR OR SEMIPOLAR GALLIUM CONTAINING MATERIALS AND PHOSPHORS

(71) Applicant: Soraa, Inc., Fremont, CA (US)

(72) Inventors: James W. Raring, Goleta, CA (US); Eric M. Hall, Goleta, CA (US); Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/035,693

(22) Filed: Sep. 24, 2013

(65) Prior Publication Data

US 2014/0213001 A1    Jul. 31, 2014

Related U.S. Application Data

(63) Continuation of application No. 13/360,535, filed on Jan. 27, 2012, now Pat. No. 8,558,265, which is a continuation of application No. 12/534,829, filed on Aug. 3, 2009, now Pat. No. 8,124,996.

(60) Provisional application No. 61/086,139, filed on Aug. 4, 2008.

(51) Int. Cl.
*H01L 33/00* (2010.01)
*H01L 33/50* (2010.01)
(Continued)

(52) U.S. Cl.
CPC .............. *H01L 33/502* (2013.01); *H01L 33/16* (2013.01); *H01L 33/54* (2013.01); *H01L 33/58* (2013.01);
(Continued)

(58) Field of Classification Search
USPC .................. 438/27; 257/13, E33.06, E33.061
See application file for complete search history.

(56) References Cited

U.S. PATENT DOCUMENTS

| 3,245,760 A | 4/1966 | Sawyer |
| 3,303,053 A | 2/1967 | Strong et al. |

(Continued)

FOREIGN PATENT DOCUMENTS

| CN | 101009347 | 3/1987 |
| CN | 1538534 | 10/2004 |

(Continued)

OTHER PUBLICATIONS

Abare, 'Cleaved and Etched Facet Nitride Laser Diodes', IEEE Journal of Selected Topics in Quantum Electronics, vol. 4, No. 3, 1998, pp. 505-509.

(Continued)

*Primary Examiner* — Victor A Mandala
(74) *Attorney, Agent, or Firm* — Kilpatrick Townsend & Stockton LLP

(57) ABSTRACT

A packaged optical device includes a substrate having a surface region with light emitting diode devices fabricated on a semipolar or nonpolar GaN substrate. The light emitting diodes emit polarized light and are characterized by an overlapped electron wave function and a hole wave function. Phosphors within the package are excited by the polarized light and, in response, emit electromagnetic radiation of a second wavelength.

45 Claims, 6 Drawing Sheets

(51) Int. Cl.
  *H01L 33/32* (2010.01)
  *H01L 33/16* (2010.01)
  *H01L 33/54* (2010.01)
  *H01L 33/58* (2010.01)

(52) U.S. Cl.
  CPC ........... H01L 2224/48091 (2013.01); H01L 2224/48247 (2013.01); H01L 2224/92247 (2013.01); H01L 2924/01012 (2013.01); H01L 2924/0102 (2013.01); H01L 2924/01025 (2013.01); H01L 2924/01057 (2013.01); H01L 2924/01063 (2013.01); H01L 2924/01078 (2013.01); H01L 2924/01079 (2013.01); H01L 2924/09701 (2013.01); H01L 2924/01019 (2013.01); H01L 2924/01021 (2013.01); H01L 2924/01037 (2013.01); H01L 2924/01322 (2013.01); H01L 2224/73265 (2013.01); H01L 33/32 (2013.01)
  USPC ............ 438/27; 257/98; 257/13; 257/E33.06; 257/E33.061

(56) References Cited

U.S. PATENT DOCUMENTS

| | | | |
|---|---|---|---|
| 3,335,084 A | 8/1967 | Hall | |
| 4,030,966 A | 6/1977 | Hornig et al. | |
| 4,341,592 A | 7/1982 | Shortes et al. | |
| 4,430,051 A | 2/1984 | von Platen | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,527,417 A | 6/1996 | Iida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,821,555 A | 10/1998 | Saito et al. | |
| 5,868,837 A | 2/1999 | DiSalvo et al. | |
| 5,888,907 A | 3/1999 | Tomoyasu et al. | |
| 5,951,923 A | 9/1999 | Horie et al. | |
| 6,069,394 A | 5/2000 | Hashimoto et al. | |
| 6,072,197 A | 6/2000 | Horino et al. | |
| 6,090,202 A | 7/2000 | Klipov | |
| 6,129,900 A | 10/2000 | Satoh et al. | |
| 6,152,977 A | 11/2000 | D'Evelyn | |
| 6,153,010 A | 11/2000 | Kiyoku et al. | |
| 6,195,381 B1 | 2/2001 | Botez et al. | |
| 6,234,648 B1 | 5/2001 | Borner et al. | |
| 6,350,191 B1 | 2/2002 | D'Evelyn | |
| 6,372,002 B1 | 4/2002 | D'Evelyn et al. | |
| 6,379,985 B1 | 4/2002 | Cervantes et al. | |
| 6,398,867 B1 | 6/2002 | D'Evelyn et al. | |
| 6,406,776 B1 | 6/2002 | D'Evelyn | |
| 6,451,157 B1 | 9/2002 | Hubacek | |
| 6,455,877 B1 | 9/2002 | Ogawa et al. | |
| 6,475,254 B1 | 11/2002 | Saak et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,635,904 B2* | 10/2003 | Goetz et al. | 257/103 |
| 6,639,925 B2 | 10/2003 | Niwa et al. | |
| 6,656,615 B2 | 12/2003 | Dwilinski et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,806,508 B2 | 10/2004 | D'Evelyn et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,858,882 B2 | 2/2005 | Tsuda et al. | |
| 6,861,130 B2 | 3/2005 | D'Evelyn et al. | |
| 6,920,166 B2 | 7/2005 | Akasaka et al. | |
| 6,936,488 B2 | 8/2005 | D'Evelyn et al. | |
| 6,955,719 B2 | 10/2005 | Dmitriev et al. | |
| 7,001,577 B2 | 2/2006 | Zimmerman et al. | |
| 7,009,199 B2 | 3/2006 | Hall | |
| 7,009,215 B2 | 3/2006 | D'Evelyn et al. | |
| 7,019,325 B2 | 3/2006 | Li et al. | |
| 7,033,858 B2* | 4/2006 | Chai et al. | 438/106 |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,112,829 B2 | 9/2006 | Picard et al. | |
| 7,122,827 B2 | 10/2006 | Alizadeh et al. | |
| 7,125,453 B2 | 10/2006 | D'Evelyn et al. | |
| 7,128,849 B2 | 10/2006 | Setlur et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,198,671 B2 | 4/2007 | Ueda | |
| 7,208,393 B2 | 4/2007 | Haskell et al. | |
| 7,220,658 B2 | 5/2007 | Haskell et al. | |
| 7,291,544 B2 | 11/2007 | D'Evelyn et al. | |
| 7,303,630 B2 | 12/2007 | Motoki et al. | |
| 7,312,156 B2 | 12/2007 | Granneman et al. | |
| 7,316,746 B2 | 1/2008 | D'Evelyn et al. | |
| 7,332,746 B1* | 2/2008 | Takahashi et al. | 257/98 |
| 7,335,262 B2 | 2/2008 | Dwilinski et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,390,359 B2 | 6/2008 | Miyanaga et al. | |
| 7,483,466 B2 | 1/2009 | Uchida et al. | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,572,425 B2 | 8/2009 | McNulty et al. | |
| 7,598,104 B2 | 10/2009 | Teng et al. | |
| 7,625,446 B2 | 12/2009 | D'Evelyn et al. | |
| 7,642,122 B2 | 1/2010 | Tysoe et al. | |
| 7,691,658 B2 | 4/2010 | Kaeding et al. | |
| 7,704,324 B2 | 4/2010 | D'Evelyn et al. | |
| 7,705,276 B2 | 4/2010 | Giddings et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,254,425 B1 | 8/2012 | Raring | |
| 8,259,769 B1 | 9/2012 | Raring et al. | |
| 8,284,810 B1 | 10/2012 | Sharma et al. | |
| 8,294,179 B1 | 10/2012 | Raring | |
| 8,314,429 B1 | 11/2012 | Raring et al. | |
| 8,351,478 B2 | 1/2013 | Raring et al. | |
| 8,355,418 B2 | 1/2013 | Raring et al. | |
| 8,558,265 B2* | 10/2013 | Raring et al. | 257/98 |
| 2001/0011935 A1 | 8/2001 | Lee et al. | |
| 2001/0048114 A1 | 12/2001 | Morita et al. | |
| 2002/0027933 A1 | 3/2002 | Tanabe et al. | |

(56) References Cited

U.S. PATENT DOCUMENTS

| | | |
|---|---|---|
| 2002/0085603 A1 | 7/2002 | Okumura |
| 2002/0105986 A1 | 8/2002 | Yamasaki |
| 2002/0171092 A1* | 11/2002 | Goetz et al. ............... 257/103 |
| 2002/0189532 A1 | 12/2002 | Motoki et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0161222 A1 | 8/2004 | Niida et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0098095 A1 | 5/2005 | D'Evelyn et al. |
| 2005/0109240 A1 | 5/2005 | Maeta et al. |
| 2005/0128469 A1 | 6/2005 | Hall et al. |
| 2005/0152820 A1 | 7/2005 | D'Evelyn et al. |
| 2005/0168564 A1 | 8/2005 | Kawaguchi et al. |
| 2005/0191773 A1 | 9/2005 | Suzuki et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1* | 12/2005 | Scherer et al. ............... 257/98 |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn et al. |
| 2006/0038193 A1 | 2/2006 | Wu et al. |
| 2006/0048699 A1 | 3/2006 | D'Evelyn et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0086319 A1 | 4/2006 | Kasai et al. |
| 2006/0096521 A1 | 5/2006 | D'Evelyn et al. |
| 2006/0126688 A1 | 6/2006 | Kneissl |
| 2006/0144334 A1 | 7/2006 | Yim et al. |
| 2006/0175624 A1* | 8/2006 | Sharma et al. ............... 257/94 |
| 2006/0177362 A1 | 8/2006 | D'Evelyn et al. |
| 2006/0193359 A1 | 8/2006 | Kuramoto |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0216416 A1 | 9/2006 | Sumakeris et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0256482 A1 | 11/2006 | Araki et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0081857 A1 | 4/2007 | Yoon |
| 2007/0086916 A1* | 4/2007 | LeBoeuf et al. ............... 422/58 |
| 2007/0093073 A1 | 4/2007 | Farrell et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0120141 A1* | 5/2007 | Moustakas et al. ........... 257/103 |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0217462 A1 | 9/2007 | Yamasaki |
| 2007/0221938 A1 | 9/2007 | Radkov et al. |
| 2007/0228404 A1 | 10/2007 | Tran et al. |
| 2007/0234946 A1 | 10/2007 | Hashimoto et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0083741 A1 | 4/2008 | Giddings et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1* | 6/2008 | Nakamura et al. ............... 257/98 |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0179607 A1 | 7/2008 | DenBaars et al. |
| 2008/0191223 A1 | 8/2008 | Nakamura et al. |
| 2008/0193363 A1 | 8/2008 | Tsuji |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0272462 A1 | 11/2008 | Shimamoto et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0092536 A1 | 4/2009 | Kawabata et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0218593 A1 | 9/2009 | Kamikawa et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321778 A1 | 12/2009 | Chen et al. |

(56) References Cited

U.S. PATENT DOCUMENTS

| | | |
|---|---|---|
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1* | 4/2010 | Kawabata et al. ............ 423/409 |
| 2010/0140745 A1 | 6/2010 | Khan et al. |
| 2010/0147210 A1 | 6/2010 | D'Evelyn |
| 2010/0151194 A1 | 6/2010 | D'Evelyn |
| 2010/0195687 A1 | 8/2010 | Okamoto et al. |
| 2010/0219505 A1 | 9/2010 | D'Evelyn |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0295088 A1 | 11/2010 | D'Evelyn et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1* | 12/2010 | Preble et al. .................... 257/76 |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0121331 A1 | 5/2011 | Simonian et al. |
| 2011/0129669 A1 | 6/2011 | Fujito et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101009347 | 8/2007 |
| CN | 101079463 | 11/2007 |
| CN | 101099245 | 1/2008 |
| CN | 101171692 | 4/2008 |
| JP | 03-287770 | 12/1991 |
| JP | 2002-252371 | 9/2002 |
| JP | 2004-207519 | 7/2004 |
| JP | 2005-244226 | 9/2005 |
| JP | 2005-289797 | 10/2005 |
| JP | 2003-101081 | 5/2006 |
| JP | 2006-257290 | 9/2006 |
| JP | 2006-308858 | 11/2006 |
| JP | 2007-039321 | 2/2007 |
| JP | 2007-173467 | 7/2007 |
| JP | 2008-091488 | 4/2008 |
| JP | 2008-159606 | 7/2008 |
| JP | 2007-188962 | 7/2011 |
| WO | WO 2005/121415 | 12/2005 |
| WO | WO 2007/004495 | 1/2007 |
| WO | WO 2007/091920 | 8/2007 |
| WO | WO 2008/041521 | 4/2008 |
| WO | WO 2012/016033 | 2/2012 |

OTHER PUBLICATIONS

Byrappa et al., 'Handbook of Hydrothermal Technology: A Technology for Crystal Growth and Materials Processing', Noyes Publications, Park Ridge, New Jersey, 2001, pp. 94-96 and 152.

Callahan et al., 'Synthesis and Growth of Gallium Nitride by the Chemical Vapor Reaction Process (CVRP)', MRS Internet Journal Nitride Semiconductor Research', vol. 4, No. 10, 1999, pp. 1-6.

Chiang et al., 'Luminescent Properties of Cerium-Activated Garnet Series Phosphor: Structure and Temperature Effects', Journal of the Electrochemical Society, vol. 155, No. 6, 2008, pp. B517-B520.

Chiu et al., 'Synthesis and Luminescence Properties of Intensely Red-Emitting $M_5Eu(WO_4)_{4-x}(MoO_4)_x$ (M=Li, Na, K) Phosphors', Journal of the Electrochemical Society, vol. 155, No. 3, 2008, pp. J71-J78.

Ci et al., '$Ca_{1-x}Mo_{1-y}Si_yO_4$:$Eu_x^{3+}$: A Novel Red Phosphor for White Light Emitting Diodes', Physica B, vol. 403, 2008, pp. 670-674.

Chinese Office Action From Chinese Patent Application No. 200980134723.8 dated Nov. 1, 2012, 22 pgs. (With Translation).

D'Evelyn et al., 'Bulk GaN Crystal Growth by the High-Pressure Ammonothermal Method', Journal of Crystal Growth, vol. 300, 2007, pp. 11-16.

Dwilinski et al., 'Ammono Method of BN, AlN and GaN Synthesis and Crystal Growth', MRS Internet Journal Nitride Semiconductor Research, vol. 3, No. 25, 1998, pp. 1-5.

Dwilinski et al., 'Excellent Crystallinity of Truly Bulk Ammonothermal GaN', Journal of Crystal Growth, vol. 310, 2008, pp. 3911-3916.

Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.

Feezell et al., 'AlGaN-Cladding-Free Nonpolar InGaN/GaN Laser Diodes', Japanese Journal of Applied Physics, vol. 46, No. 13, 2007, pp. L284-L286.

Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.

Franssila, 'Tools for CVD and Epitaxy', Introduction to Microfabrication, 2004, pp. 329-336.

Frayssinet et al., 'Evidence of Free Carrier Concentration Gradient Along the c-Axis for Undoped GaN Single Crystals', Journal of Crystal Growth, vol. 230, 2001, pp. 442-447.

Fukuda et al., 'Prospects for the Ammonothermal Growth of Large GaN Crystal', Journal of Crystal Growth, vol. 305, 2007, pp. 304-310.

Happek, 'Development of Efficient UV-LED Phosphor Coatings for Energy Saving Solid State Lighting', University of Georgia, 2007, 22 pages.

Hashimoto et al., 'A GaN bulk crystal with improved structural quality grown by the ammonothermal method', Nature Materials, vol. 6, 2007, pp. 568-671.

Hashimoto et al., 'Ammonothermal Growth of Bulk GaN', Journal of Crystal Growth, vol. 310, 2008, pp. 3907-3910.

Hoppe et al., 'Luminescence in $Eu^{2+}$-Doped $Ba_2Si_5N_8$: Fluorescence, Thermoluminescence, and Upconversion', Journal of Physics and Chemistry of Solids, vol. 61, 2000, pp. 2001-2006.

Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.

Khan, 'Cleaved Cavity Optically Pumped InGaN-GaN Laser Grown on Spinel Substrates', Applied Physics Letters, vol. 69, No. 16, 1996, pp. 2417-2420.

Kim et al., 'Improved Electroluminescence on Nonpolar m-Plane InGaN/GaN Qantum Well LEDs', Rapid Research Letters, vol. 1, No. 3, 2007, pp. 125-127.

(56) References Cited

OTHER PUBLICATIONS

Kojima et al., 'Stimulated Emission At 474 nm From an InGaN Laser Diode Structure Grown on a (1122) GaN Substrate', Applied Physics Letters, vol. 91, 2007, pp. 251107-251107-3.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.
Li et al., 'The Effect of Replacement of Sr by Ca OnThe Structural and Luminescence Properties of the Red-Emitting Sr2Si5N8:Eu2+ LED Conversion Phosphor', Journal of Solid State Chemistry, vol. 181, 2007, pp. 515-524.
Lide et al., 'Thermal Conductivity of Ceramics and Other Insulating Materials', CRC Handbook of Chemistry and Physics, 91st Edition, 2010-2011, pp. 12-203 and 12-204.
Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, pp. 7032-7035.
http://www.matbase.com/material/non-ferrous-metals/other/molybdenum/properties, Data Table for: Non-Ferrous Metals: Other Metals: Molybdenum, Mar. 28, 2011, pp. 1.
Mirwald et al., 'Low-Friction Cell for Piston-Cylinder High Pressure Apparatus', Journal of Geophysical Research, vol. 80, No. 11, 1975, pp. 1519-1525.
Motoki et al., 'Growth and Characterization of Freestanding GaN Substrates', Journal of Crystal Growth, vol. 237-239, 2002, pp. 912-921.
Mueller-Mach et al., 'Highly Efficient All-Nitride Phosphor-Converted White Light Emitting Diode', Physica Status Solidi (a), vol. 202, 2005, pp. 1727-1732.
Murota et al., 'Solid State Light Source Fabricated With YAG:Ce Single Crystal', Japanese Journal of Applied Physics, vol. 41, Part 2, No. 8A, 2002, pp. L887-L888.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.
Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, pp. 072201-1-072201-3.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Park, 'Crystal Orientation Effects on Electronic Properties of Wurtzite InGaN/GaN Quantum Wells', Journal of Applied Physics, vol. 91, No. 12, 2002, pp. 9903-9908.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report of PCT Application No. PCT/US2009/052611, dated Sep. 29, 2009, 14 pages total.
International Preliminary Report & Written Opinion of PCT Application No. PCT/US2011/037792, dated Dec. 6, 2012, 8 pages total.
Peters, 'Ammonothermal Synthesis of Aluminium Nitride', Journal of Crystal Growth, vol. 104, 1990, pp. 411-418.
Romanov et al., 'Strain-Induced Polarization in Wurtzite III-Nitride Semipolar Layers', Journal of Applied Plyiscs, vol. 100, 2006, pp. 023522-1 through 023522-10.
Sarva et al., 'Dynamic Compressive Strength of Silicon Carbide Under Uniaxial Compression', Material Sciences and Engineering, vol. A317, 2001, pp. 140-144.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Schoedl, 'Facet Degradation of GaN Heterostructure Laser Diodes', Journal of Applied Physics, vol. 97, issue 12, 2006, pp. 123102-1-123102-8.
Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, pp. 3314-3322.
Sizov et al., '500-nm Optical Gain Anisotropy of Semipolar (1122) InGaN Quantum Wells', Applied Physics Express, vol. 2, 2009, pp. 071001-1-071001-3.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Communication from the Japanese Patent Office re 2011-522148 dated Mar. 14, 2013, (5 pages).
Communication from the Japanese Patent Office re 2011-522148, dated Oct. 22, 2013, (6 pages).
Wang et al , 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M = Nb, P) Phosphors for Light-Emitting Diodes', Physica B, vol. 403, 2008, pp. 2071-2075.
Yamamoto, 'White LED Phosphors: The Next Step', Proceeding of SPIE, 2010, pp. 1-10.
Yang et al., 'Preparation and luminescence properties of LED conversion novel phosphors SrZn02:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).

(56) References Cited

OTHER PUBLICATIONS

USPTO Office Action for U.S. Appl. No. 12/481,543 dated Jun. 27, 2011 (9 pages).
USPTO Office Action for U.S. Appl. No. 12/482,440 dated Feb. 23, 2011 (5 pages).
USPTO Office Action for U.S. Appl. No. 12/482,440 dated Aug. 12, 2011 (6 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/484,924 dated Apr. 14, 2011 (11 pages).
USPTO Office Action for U.S. Appl. No. 12/484,924 dated Oct. 31, 2011 (10 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/497,969 dated Feb. 2, 2012 (19 pages).
USPTO Office Action for U.S. Appl. No. 12/502,058 dated Dec. 8, 2010 (14 pages).
USPTO Office Action for U.S. Appl. No. 12/502,058 dated Aug. 19, 2011 (12 pages).
USPTO Notice of Allowance for U.S. Appl. No. 12/502,058 dated Apr. 16, 2012 (10 pages).
USPTO Notice of Allowance for U.S. Appl. No. 12/502,058 dated Jul. 19, 2012 (8 pages).
USPTO Office Action for U.S. Appl. No. 12/534,829 dated Apr. 19, 2011 (8 pages).
USPTO Notice of Allowance for U.S. Appl. No. 12/534,829 dated Oct. 28, 2011 (7 pages).
USPTO Notice of Allowance for U.S. Appl. No. 12/534,829 dated Dec. 5, 2011 (7 pages).
USPTO Notice of Allowance for U.S. Appl. No. 12/534,829 dated Dec. 21, 2011 (4 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Office Action for U.S. Appl. No. 12/569,841 dated Dec. 23, 2011 (12 pages).
USPTO Office Action for U.S. Appl. No. 12/573,820 dated Mar. 2, 2011 (18 pages).
USPTO Office Action for U.S. Appl. No. 12/573,820 dated Oct. 11, 2011 (22 pages).
USPTO Office Action for U.S. Appl. No. 12/634,665 dated Apr. 25, 2012 (10 pages).
USPTO Office Action for U.S. Appl. No. 12/724,983 dated Mar. 5, 2012 (20 pages).
USPTO Office Action for U.S. Appl. No. 12/749,466 dated Jun. 29, 2011 (19 pages).
USPTO Office Action for U.S. Appl. No. 12/749,466 dated Feb. 3, 2012 (14 pages).
USPTO Office Action for U.S. Appl. No. 12/749,466 dated Jul. 3, 2012 (18 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/759,273 dated Nov. 21, 2011 (9 pages).
USPTO Office Action for U.S. Appl. No. 12/759,273 dated Jun. 26, 2012 (10 pages).
USPTO Office Action for U.S. Appl. No. 12/762,269 dated Oct. 12, 2011 (11 pages).
USPTO Notice of Allowance for U.S. Appl. No. 12/762,269 dated Apr. 23, 2012 (8 pages).
USPTO Office Action for U.S. Appl. No. 12/762,271 dated Dec. 23, 2011 (11 pages).
USPTO Office Action for U.S. Appl. No. 12/762,271 dated Jun. 6, 2012 (12 pages).
USPTO Notice of Allowance for U.S. Appl. No. 12/762,271 dated Aug. 8, 2012 (8 pages).
USPTO Notice of Allowance for U.S. Appl. No. 12/762,278 dated Nov. 7, 2011 (10 pages).
USPTO Office Action for U.S. Appl. No. 12/778,718 dated Nov. 25, 2011 (11 pages).
USPTO Notice of Allowance for U.S. Appl. No. 12/778,718 dated Apr. 3, 2012 (13 pages).
USPTO Notice of Allowance for U.S. Appl. No. 12/778,718 dated Jun. 13, 2012 (7 pages).
USPTO Office Action for U.S. Appl. No. 12/785,404 dated Mar. 6, 2012 (9 pages).
USPTO Office Action for U.S. Appl. No. 12/789,303 dated Sep. 24, 2012 (19 pages).
USPTO Office Action for U.S. Appl. No. 12/859,153 dated Sep. 25, 2012 (21 pages).
USPTO Office Action for U.S. Appl. No. 12/859,153 dated Feb. 26, 2013 (23 pages).
USPTO Office Action for U.S. Appl. No. 12/868,441 dated Apr. 30, 2012 (11 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/883,093 dated Mar. 13, 2012 (9 pages).
USPTO Office Action for U.S. Appl. No. 12/883,093 dated Aug. 3, 2012 (12 pages).
USPTO Notice of Allowance for U.S. Appl. No. 12/883,093 dated Nov. 21, 2012 (12 pages).
USPTO Office Action for U.S. Appl. No. 12/883,652 dated Apr. 17, 2012 (7 pages).
USPTO Office Action for U.S. Appl. No. 12/884,993 dated Mar. 16, 2012 (12 pages).

(56) References Cited

OTHER PUBLICATIONS

USPTO Office Action for U.S. Appl. No. 12/884,993 dated Aug. 2, 2012 (14 pages).
USPTO Notice of Allowance for U.S. Appl. No. 12/884,993 dated Nov. 26, 2012 (6 pages).
USPTO Office Action for U.S. Appl. No. 12/942,817 dated Feb. 20, 2013 (11 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/046,565 dated Nov. 7, 2011 (16 pages).
USPTO Office Action for U.S. Appl. No. 13/046,565 dated Feb. 2, 2012 (16 pages).
USPTO Office Action for U.S. Appl. No. 13/046,565 dated Apr. 13, 2012 (39 pages).
USPTO Office Action for U.S. Appl. No. 13/046,565 dated Jul. 19, 2012 (23 pages).
USPTO Notice of Allowance for U.S. Appl. No. 13/108,645 dated Jan. 28, 2013 (8 pages).
USPTO Office Action for U.S. Appl. No. 13/291,922 dated Feb. 20, 2013 (9 pages).
USPTO Office Action for U.S. Appl. No. 13/354,639 dated Nov. 7, 2012 (11 pages).
USPTO Notice of Allowance for U.S. Appl. No. 13/354,639 dated Dec. 14, 2012 (8 pages).
USPTO Office Action for U.S. Appl. No. 13/360,535 dated May 10, 2013 (13 pages).
USPTO Notice of Allowance for U.S. Appl. No. 13/360,535 dated Jun. 10, 2013 (8 pages).
USPTO Office Action for U.S. Appl. No. 13/425,354 dated Feb. 14, 2013 (12 pages).
USPTO Office Action for U.S. Appl. No. 13/548,770 dated Mar. 12, 2013 (5 pages).
USPTO Office Action for U.S. Appl. No. 13/606,894 dated Feb. 5, 2013 (7 pages).
Detchprohm et al., 'Green light emitting diodes on a-plane GaN bulk subtrates', Applied Physics Letters, vol. 92, No. 241109, Jun. 17, 2008, pp. 1-3.
Schmidt et al., 'High Power and High External Efficiency m-Plane InGaN Light Emitting Diodes', Japanese Journal of Applied Physics, vol. 46, No. 7, 2007, pp. L126-L128.
Tyagi et al., 'High Brightness Violet InGaN/GaN Light Emitting Diodes on Semipolar (1011) Bulk GaN Substrates', Japanese Journal of Applied Physics, vol. 46, No. 7, 2007, pp. L129-L131.
Search Report from the European Patent Office re 09805406.7 dated Jul. 29, 2014 (10 pages).
Communication from the Chinese Patent Office re 200980134723.8 dated Jun. 19, 2014 (14 pages).
Waltereit et al., 'Nitride Semiconductors Free of Electrostatic Fields for Efficient White Light-Emitting Diodes', Letters to Nature: International Weekly Journal of Science, vol. 406, 2000, pp. 865-868.

\* cited by examiner

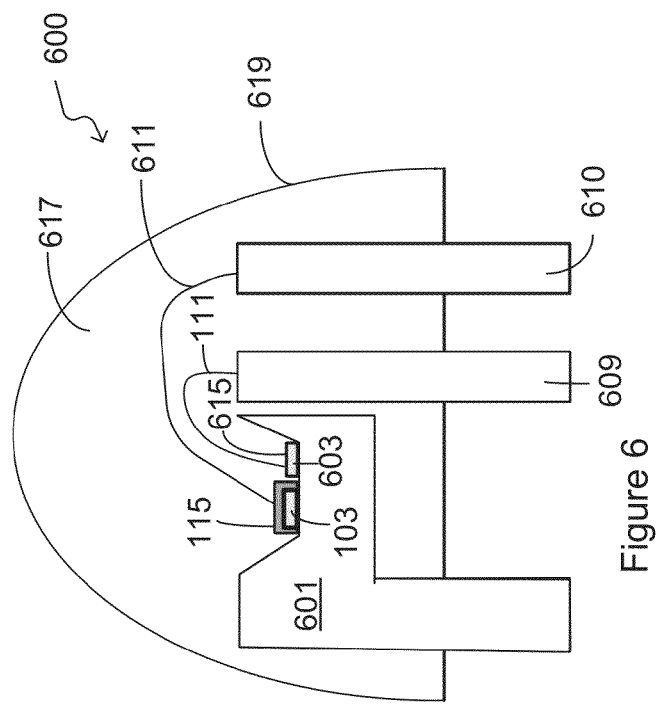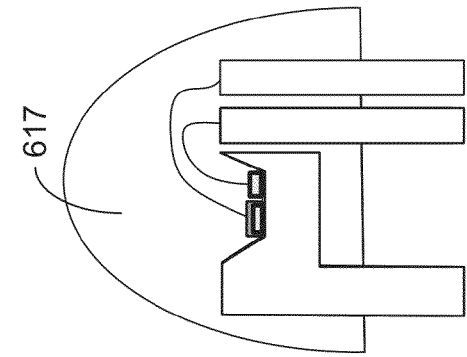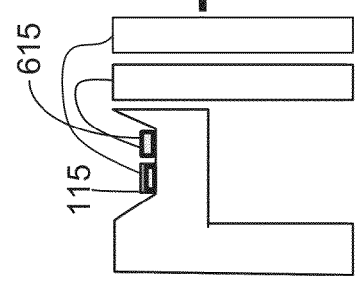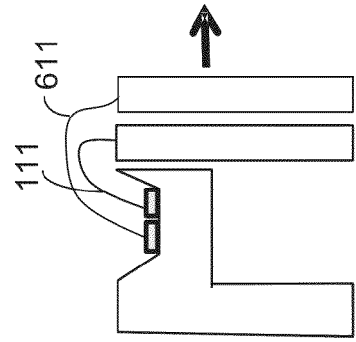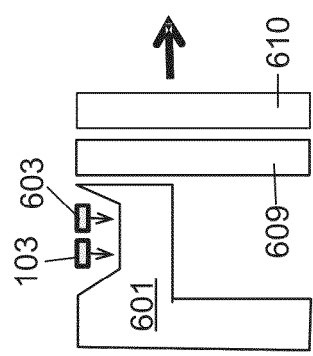

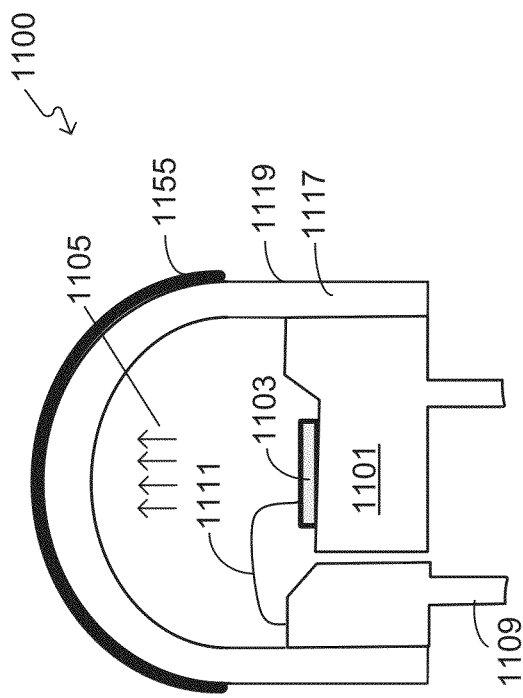
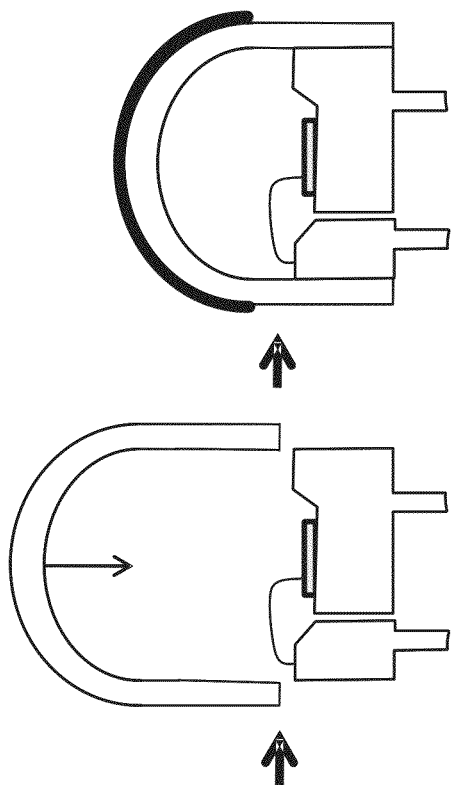
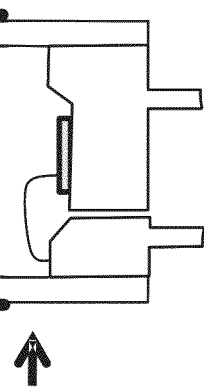
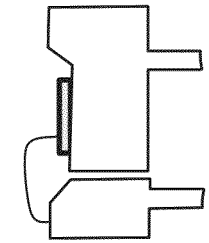
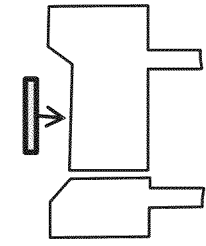

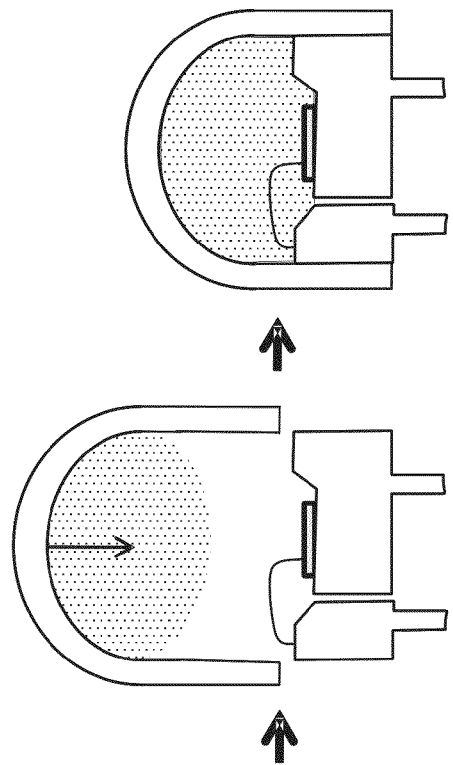
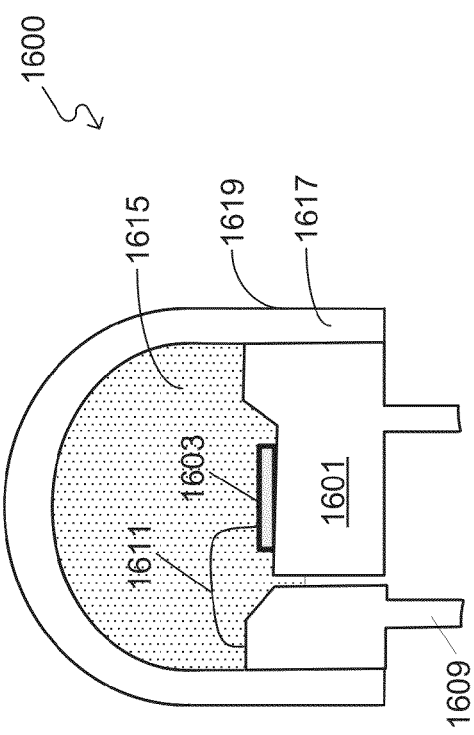
Figure 16
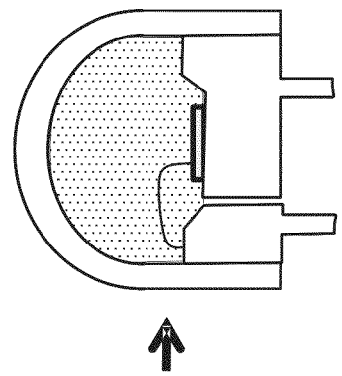
Figure 17
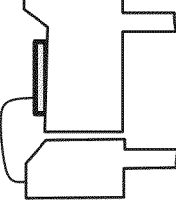
Figure 18
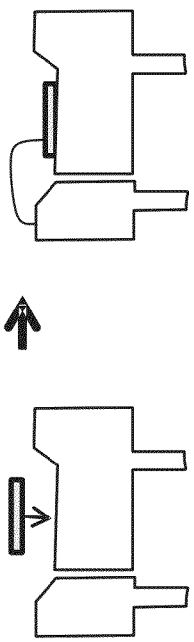
Figure 19
Figure 20

US 8,956,894 B2

WHITE LIGHT DEVICES USING NON-POLAR OR SEMIPOLAR GALLIUM CONTAINING MATERIALS AND PHOSPHORS

CROSS-REFERENCE TO RELATED APPLICATIONS

This application is a continuation of U.S. application Ser. No. 13/360,535, filed on Jan. 27, 2012, now allowed, which is a continuation of U.S. application Ser. No. 12/534,829, filed on Aug. 3, 2009, which issued as U.S. Pat. No. 8,124,996, which claims the benefit of U.S. Provisional Application No. 61/086,139, filed on Aug. 4, 2008, which is incorporated by reference in its entirety for all purposes.

BACKGROUND OF THE INVENTION

The present invention relates generally to lighting techniques. More specifically, embodiments of the invention include techniques for combining colored LED devices, such as violet, blue, blue and yellow, or blue and green, fabricated on bulk semipolar or nonpolar materials with use of entities such as phosphors, which emit light. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

From the above, it is seen that techniques for improving optical devices is highly desired.

BRIEF SUMMARY OF THE INVENTION

The present invention provides a packaged light emitting device which includes a substrate member having a surface region. One or more light emitting diode devices are overlying the surface region. At least one of the light emitting diode device is fabricated on a semipolar or nonpolar gallium and nitrogen (e.g., GaN) containing substrate. The light emitting diode devices are fabricated on the semipolar or nonpolar gallium and nitrogen (e.g., GaN) containing substrate and emit substantially polarized emission of first wavelengths. In a specific embodiment, the device also has an optically transparent member coupled to the light emitting diode devices. An optical path is provided between the light emitting diode devices and the optically transparent member. In a specific embodiment, the phosphors are formed near or overlying the optically transparent member. Alternatively, the phosphors are formed within the optically transparent member or underlying the optically transparent member or any combination of these configurations. The entities are excited by the substantially polarized emission, which is direct or reflected or a combination to emit electromagnetic radiation second wavelengths.

In a specific embodiment, the present invention includes device configurations having different spatial locations for the thickness of the entities. The thickness of the entities is formed within the optically transparent member. Alternatively, the thickness of the entities is formed underlying the optically transparent member according to a specific embodiment. In yet an alternative specific embodiment, the thickness of the entities is formed within a spatial region of the light path between the light emitting diode devices and the optically transparent member.

In yet an alternative specific embodiment, the present invention provides a packaged light emitting device. The device includes a substrate member having a surface region and light emitting diode devices overlying the surface region. At least one of the light emitting diode device is fabricated on a semipolar or nonpolar gallium and nitrogen (e.g., GaN) containing substrate. The light emitting diode devices are fabricated on the semipolar or nonpolar gallium and nitrogen (e.g., GaN) containing substrate and emit substantially polarized emission of first wavelengths. At least one of the light emitting diode devices comprises a quantum well region, which is characterized by an electron wave function and a hole wave function. In a specific embodiment, the electron wave function and the hole wave function are substantially overlapped within a predetermined spatial region of the quantum well region. The device has a thickness of entities formed overlying the light emitting diode devices. The entities are excited by the substantially polarized emission to emit electromagnetic radiation of second wavelengths.

Still further, the present invention provides a packaged light emitting device. The device includes a substrate member having a surface region. The device includes light emitting diode devices overlying the surface region. At least one of the light emitting diode device is fabricated on a semipolar or nonpolar gallium and nitrogen (e.g., GaN) containing substrate and emit substantially polarized emissions of first wavelengths. At least one of the light emitting diode devices includes a quantum well region, which is characterized by an electron wave function and a hole wave. The electron wave function and the hole wave function are substantially overlapped within a predetermined spatial region of the quantum well region. The device also has a thickness of entities operably coupled to the light emitting diode devices. In a specific embodiment, the entities are excited by the substantially polarized emission and emit electromagnetic radiation of second wavelengths. Depending upon the embodiment, the entities are formed overlying the light emitting diode devices, or within a vicinity of the light emitting devices. The electromagnetic radiation is characterized by reflected emission, direct emission, or a combination of reflected and direct emission.

In yet an alternative embodiment, the present invention provides a method of assembling a light emitting device. The method includes providing a substrate member comprising a surface region. The method also includes providing light emitting diode devices overlying the surface region. At least one of the light emitting diode device is fabricated on a semipolar or nonpolar gallium and nitrogen containing substrate. The light emitting diode devices are fabricated on the semipolar or nonpolar gallium and nitrogen containing substrate and emit substantially polarized emission of first wavelengths. At least one of the light emitting diode devices comprises a quantum well region, which is characterized by an electron wave function and a hole wave function. The electron wave function and the hole wave function are substantially overlapped within a predetermined spatial region of the quantum well region. The method includes coupling a thickness of entities to the light emitting diode devices. The entities are excited by the substantially polarized emission, and emit electromagnetic radiation of second wavelengths.

The present device and method provides for an improved lighting technique with improved efficiencies. The present method and resulting structure are easier to implement using conventional technologies. In some embodiments, the present device and method provide a mix of polarized and unpolarized light that are useful in displays and in conjunction with polarizing transmission filters. In a specific embodiment, the blue LED device is capable of emitting electromagnetic radiation at a wavelength range from about 450 nanometers to about 495 nanometers, and the yellow-green LED device is capable of emitting electromagnetic radiation at a wavelength range from about 495 nanometers to about 590 nanometers, although there can also be some variations.

A further understanding of the nature and advantages of the present invention may be realized by reference to the latter portions of the specification and attached drawings.

BRIEF DESCRIPTION OF THE DRAWINGS

FIG. 6 is a simplified diagram of an alternative packaged light emitting device using multiple devices according to an embodiment of the present invention;

FIGS. 7 through 10 illustrate a simplified method of assembling the light emitting device of FIG. 6 according to an embodiment of the present invention;

FIG. 11 is a simplified diagram of yet an alternative packaged light emitting device using an optical path to a plane region according to an embodiment of the present invention;

FIGS. 12 through 15 illustrate a simplified method of assembling the light emitting device of FIG. 11 according to an embodiment of the present invention;

FIG. 16 is a simplified diagram of a yet an alternative packaged light emitting device using an optical path to a plane region and filler material according to an embodiment of the present invention;

FIGS. 17 through 20 illustrate a simplified method of assembling the light emitting device of FIG. 16 according to an embodiment of the present invention;

DETAILED DESCRIPTION OF THE INVENTION

Figure 1:
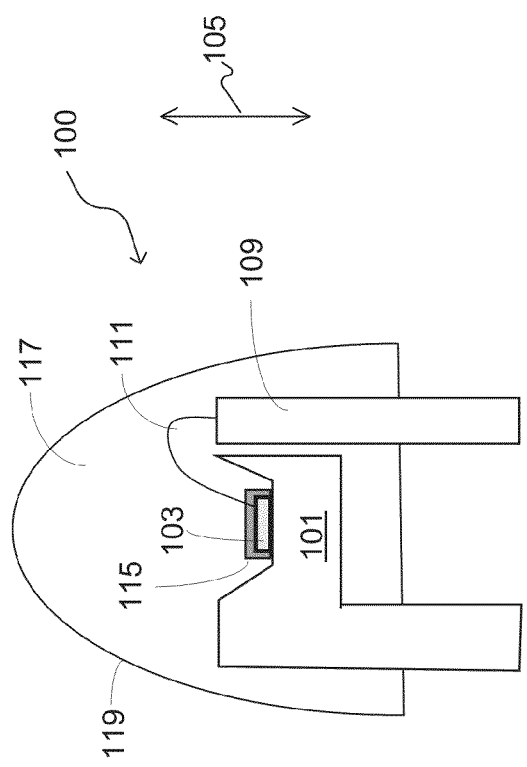
FIG. 1 is a simplified diagram of a packaged light emitting device using a recessed configuration according to an embodiment of the present invention.

Recent breakthroughs in the field of GaN-based optoelectronics have demonstrated the great potential of devices fabricated on bulk nonpolar and semipolar GaN substrates. The lack of strong polarization induced electric fields that plague conventional devices on c-plane GaN leads to a greatly enhanced radiative recombination efficiency in the light emitting InGaN layers. Furthermore, the nature of the electronic band structure and the anisotropic in-plane strain leads to highly polarized light emission, which will offer several advantages in applications such as display backlighting.

Of particular importance to the field of lighting is the progress of light emitting diodes (LED) fabricated on nonpolar and semipolar GaN substrates. Such devices making use of InGaN light emitting layers have exhibited record output powers at extended operation wavelengths into the violet region (390-430 nm), the blue region (430-490 nm), the green region (490-560 nm), and the yellow region (560-600 nm). For example, a violet LED, with a peak emission wavelength of 402 nm, was recently fabricated on an m-plane (1-100) GaN substrate and demonstrated greater than 45% external quantum efficiency, despite having no light extraction enhancement features, and showed excellent performance at high current densities, with minimal roll-over [K.-C. Kim, M. C. Schmidt, H. Sato, F. Wu, N. Fellows, M. Saito, K. Fujito, J. S. Speck, S, Nakamura, and S. P. DenBaars, "Improved electroluminescence on nonpolar m-plane InGaN/GaN quantum well LEDs", Phys. Stat. Sol. (RRL) 1, No. 3, 125 (2007).]. Similarly, a blue LED, with a peak emission wavelength of 468 nm, exhibited excellent efficiency at high power densities and significantly less roll-over than is typically observed with c-plane LEDs [K. Iso, H. Yamada, H. Hirasawa, N. Fellows, M. Saito, K. Fujito, S. P. DenBaars, J. S. Speck, and S, Nakamura, "High brightness blue InGaN/GaN light emitting diode on nonpolar m-plane bulk GaN substrate", Japanese Journal of Applied Physics 46, L960 (2007).]. Two promising semipolar orientations are the (10-1-1) and (11-22) planes. These planes are inclined by 62.0 degrees and by 58.4 degrees, respectively, with respect to the c-plane. University of California, Santa Barbara (UCSB) has produced highly efficient LEDs on (10-1-1) GaN with over 65 mW output power at 100 mA for blue-emitting devices [H. Zhong, A. Tyagi, N. Fellows, F. Wu, R. B. Chung, M. Saito, K. Fujito, J. S. Speck, S. P. DenBaars, and S, Nakamura, "High power and high efficiency blue light emitting diode on free-standing semipolar (1011) bulk GaN substrate", Applied Physics Letters 90, 233504 (2007)] and on (11-22) GaN with over 35 mW output power at 100 mA for blue-green emitting devices [H. Zhong, A. Tyagi, N. N. Fellows, R. B. Chung, M. Saito, K. Fujito, J. S. Speck, S. P. DenBaars, and S, Nakamura, Electronics Lett. 43, 825 (2007)], over 15 mW of power at 100 mA for green-emitting devices [H. Sato, A. Tyagi, H. Zhong, N. Fellows, R. B. Chung, M. Saito, K. Fujito, J. S. Speck, S. P. DenBaars, and S, Nakamura, "High power and high efficiency green light emitting diode on free-standing semipolar (1122) bulk GaN substrate", Physical Status Solid—Rapid Research Letters 1, 162 (2007)] and over 15 mW for yellow devices [H. Sato, R. B. Chung, H. Hirasawa, N. Fellows, H. Masui, F. Wu, M. Saito, K. Fujito, J. S. Speck, S. P. DenBaars, and S, Nakamura, "Optical properties of yellow light-emitting diodes grown on semipolar (1122) bulk GaN substrates," Applied Physics Letters 92, 221110 (2008).]. The UCSB group has shown that the indium incorporation on semipolar (11-22) GaN is comparable to or greater than that of c-plane GaN, which provides further promise for achieving high crystal quality extended wavelength emitting InGaN layers.

With high-performance single-color non-polar and semi-polar LEDs, several types of white light sources are now possible. In one embodiment, a violet non-polar or semi-polar LED is packaged together with at least one phosphor. In a preferred embodiment, the phosphor comprises a blend of three phosphors, emitting in the blue, the green, and the red. In another embodiment, a blue non-polar or semi-polar LED is packaged together with at least one phosphor. In a preferred embodiment, the phosphor comprises a blend of two phosphors, emitting in the green and the red. In still another embodiment, a green or yellow non-polar or semi-polar LED is packaged together with a blue LED and at least one phosphor. In a preferred embodiment, the phosphor emits in the red. In a preferred embodiment, the blue LED constitutes a blue non-polar or semi-polar LED.

A non-polar or semi-polar LED may be fabricated on a bulk gallium nitride substrate. The gallium nitride substrate may be sliced from a boule that was grown by hydride vapor phase epitaxy or ammonothermally, according to methods known in the art. In one specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. Semipolar planes may be designated by (hkil) Miller indices, where i=−(h+k), l is nonzero and at least one of h and k are nonzero. The gallium nitride substrate may be cut, lapped, polished, and chemical-mechanically polished. The gallium nitride substrate orientation may be within ±5 degrees, ±2 degrees, ±1 degree, or ±0.5 degrees of the {1 −1 0 0} m plane, the {1 1 −2 0} a plane, the {1 1 −2 2} plane, the {2 0 −2 ±1} plane, the {1 −1 0 ±1} plane, the {1 −1 0 ±2} plane, or the {1 −1 0 ±3} plane. The gallium nitride substrate may have a dislocation density in the plane of the large-area surface that can be less than $10^6$ cm$^{-2}$ and is usually less than $10^3$ cm$^{-2}$. The gallium nitride substrate may have a dislocation density in the c plane that can be less than $10^6$ cm$^{-2}$ and is preferably less than $10^3$ cm$^{-2}$.

A homoepitaxial non-polar or semi-polar LED is fabricated on the gallium nitride substrate according to methods that are known in the art, for example, following the methods disclosed in U.S. Pat. No. 7,053,413, which is hereby incorporated by reference in its entirety. At least one $Al_xIn_yGa_{1-x-y}N$ layer, where 0≤x≤1, 0≤y≤1, and 0≤x+y≤1, is deposited on the substrate, for example, following the methods disclosed by U.S. Pat. Nos. 7,338,828 and 7,220,324, which are hereby incorporated by reference in their entirety. The at least one $Al_xIn_yGa_{1-x-y}N$ layer may be deposited by metal-organic chemical vapor deposition, by molecular beam epitaxy, by hydride vapor phase epitaxy, or by a combination thereof. In one embodiment, the $Al_xIn_yGa_{1-x-y}N$ layer comprises an active layer that preferentially emits light when an electrical current is passed through it. In one specific embodiment, the active layer comprises a single quantum well, with a thickness between about 0.5 nm and about 40 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In still another embodiment, the active region comprises a double heterostructure, with a thickness between about 40 nm and about 500 nm. In one specific embodiment, the active layer comprises an $In_yGa_{1-y}N$ layer, where 0≤y≤1.

In a specific embodiment, the present invention provides novel packages and devices including at least one non-polar or at least one semi-polar homoepitaxial LED placed on a substrate. The present packages and devices are combined with phosphors to discharge white light.

FIG. 1 is a simplified diagram of a packaged light emitting device 100 using a recessed configuration according to an embodiment of the present invention. In a specific embodiment, the present invention provides a packaged light emitting device 100. As shown, the device has a substrate member having a surface region made of a suitable material such a metal including, but not limited to, Alloy 42, copper, plastics, dielectrics, and the like. The substrate is generally a lead frame member such as metal alloy.

The substrate, which holds the LED, can come in various shapes, sizes, and configurations. In a specific embodiment, the surface region of substrate 101 is cupped. Alternatively, the surface region 101 is recessed The surface region generally comprises a smooth surface, plating, or coating. Such plating or coating can be gold, silver, platinum, aluminum, or any pure or alloy material, which is suitable for bonding to an overlying semiconductor material, but can be others.

Figure 1A:
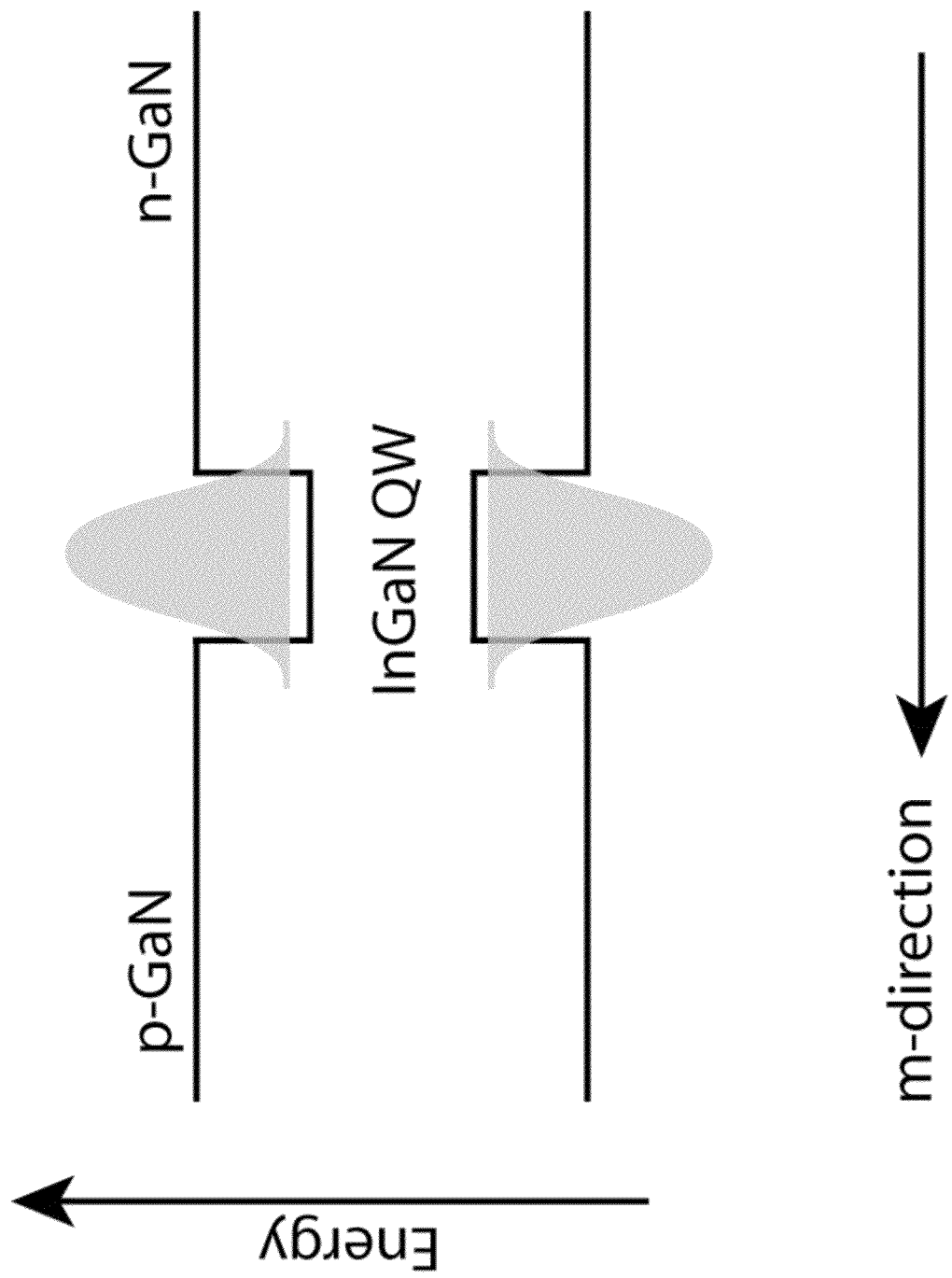
FIG. 1A illustrates an electron/hole wave functions according to an embodiment of the present invention.

Referring again to FIG. 1, the device has light emitting diode devices overlying the surface region. At least one of the light emitting diode devices 103 is fabricated on a semipolar or nonpolar GaN containing substrate. In a specific embodiment, the device emits polarized electromagnetic radiation 105. As shown, the light emitting device is coupled to a first potential, which is attached to the substrate, and a second potential 109, which is coupled to wire or lead 111 bonded to a light emitting diode. Preferably at least one of the light emitting diode devices includes a quantum well region characterized by an electron wave function and a hole wave function. The electron wave function and the hole wave function are substantially overlapped within a predetermined spatial region of the quantum well region. An example of the electron wave function and the hole wave function is provided by FIG. 1A, but can be others.

In a preferred embodiment, the light emitting diode devices comprise at least a blue LED device which emits substantially polarized emission is blue light at a range from about 430 nanometers to about 490 nanometers. In a specific embodiment, a {1 −1 0 0} m-plane bulk substrate is provided for the nonpolar blue LED. In another specific embodiment, a {1 0 −1 −1} semi-polar bulk substrate is provided for the semipolar blue LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 8 nm of InGaN and 37.5 nm of GaN as the barrier layers. Next, a 10 nm undoped AlGaN electron blocking layer is deposited. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $300 \times 300$ μm$^2$, are formed by photolithography and dry etching using a chlorine-based inductively-coupled plasma (ICP) technique. Ti/Al/Ni/Au is e-beam evaporated onto the exposed n-GaN layer to form the n-type contact, Ti/Au is e-beam evaporated onto a portion of the ITO layer to form a p-contact pad, and the wafer is diced into discrete LED dies. Electrical contacts are formed by conventional wire bonding. In a specific embodiment, the present device also has a thickness 115 of preferably phosphor entities formed overlying light emitting diode devices. The entities are excited by the substantially polarized emission and emit electromagnetic radiation of second wavelengths. In a preferred embodiment, the emit substantially yellow light from an interaction with the substantially polarized emission of blue light. Preferably the entities are phosphor entities about five microns or less thick.

In a specific embodiment, the entities comprises a phosphor or phosphor blend selected from one or more of (Y,Gd, Tb,Sc,Lu,La)$_3$(Al,Ga,In)$_5$O$_{12}$:Ce$^{3+}$, SrGa$_2$S$_4$:Eu$^{2+}$, SrS: Eu$^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is selected from one or more of (Gd,Y,Lu,La)$_2$O$_3$:Eu$^{3+}$, Bi$^{3+}$; (Gd,Y,Lu,La)$_2$O$_2$S:Eu$^{3+}$, Bi$^{3+}$; (Gd,Y,Lu,La)VO$_4$:Eu$^{3+}$, Bi$^{3+}$; Y$_2$(O,S)$_3$:Eu$^{3+}$; Ca$_{1-x}$Mo$_{1-y}$Si$_y$O$_4$: where $0.05 \leq x \leq 0.5$, $0 \leq y \leq 0.1$; (Li,Na,K)$_5$Eu(W,Mo) O$_4$; (Ca,Sr)S:Eu$^{2+}$; SrY$_2$S$_4$:Eu$^{2+}$; CaLa$_2$S$_4$:Ce$^{3+}$; (Ca,Sr)S: Eu$^{2+}$; 3.5MgO*0.5MgF$_2$*GeO$_2$:Mn$^{4+}$ (MFG); (Ba,Sr,Ca) Mg$_x$P$_2$O$_7$:Eu$^{2+}$, Mn$^{2+}$; (Y,Lu)$_2$WO$_6$:Eu$^{3+}$, Mo$^{6+}$; (Ba,Sr, Ca)$_3$Mg$_x$Si$_2$O$_8$:Eu$^{2+}$, Mn$^{2+}$, wherein $1 < x \leq 2$; (RE$_{1-y}$Ce$_y$) Mg$_{2-x}$Li$_x$Si$_{3-x}$P$_x$O$_{12}$, where RE is at least one of Sc, Lu, Gd, Y, and Tb, $0.0001 < x \leq 0.1$ and $0.001 < y < 0.1$; (Y,Gd,Lu,La)$_{2-x}$E-u$_x$W$_{1-y}$Mo$_y$O$_6$, where $0.5 \leq x \leq 1.0$, $0.01 \leq y \leq 1.0$; (SrCa)$_{1-x}$Eu$_x$Si$_5$N$_8$, where $0.01 \leq x \leq 0.3$; SrZnO$_2$:Sm$^{+3}$; M$_m$O$_n$X wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and Eu$^{3+}$ activated phosphate or borate phosphors; and mixtures thereof.

In a specific embodiment, the light emitting diode device includes at least a violet LED device capable of emitting electromagnetic radiation at a range from about 380 nanometers to about 440 nanometers and the one or more entities are capable of emitting substantially white light, the substantially polarized emission being violet light. In a specific embodiment, a (1 −1 0 0) m-plane bulk substrate is provided for the nonpolar violet LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 16 nm of InGaN and 18 nm of GaN as the barrier layers. Next, a 10 nm undoped AlGaN electron blocking layer is deposited. Finally, a p-type GaN contact layer is deposited, with a thickness of about 160 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $300 \times 300$ μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding. Other colored LEDs may also be used or combined according to a specific embodiment.

In a specific embodiment, a (1 1 −2 2) bulk substrate is provided for a semipolar green LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 1 micron and a doping level of about $2 \times 10^{18}$ cm$^{-3}$. Next, an InGaN/GaN multiple quantum well (MQW) is deposited as the active layer. The MQW superlattice has six periods, comprising alternating layers of 4 nm of InGaN and 20 nm of Si-doped GaN as the barrier layers and ending with an undoped 16 nm GaN barrier layer and a 10 nm undoped $Al_{0.15}Ga_{0.85}N$ electron blocking layer. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $200 \times 550$ μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In another specific embodiment, a (1 1 –2 2} bulk substrate is provided for a semipolar yellow LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 2 microns and a doping level of about $2 \times 10^{18}$ cm$^{-3}$. Next, a single quantum well (SQW) is deposited as the active layer. The SQW comprises a 3.5 nm InGaN layer and is terminated by an undoped 16 nm GaN barrier layer and a 7 nm undoped $Al_{0.15}Ga_{0.85}N$ electron blocking layer. Finally, a Mg-doped p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $600 \times 450$ μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$; $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+}$, $Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

The above has been generally described in terms of entities that are phosphor materials or phosphor like materials, but it would be recognized that other "energy-converting luminescent materials", which may include phosphors, semiconductors, semiconductor nanoparticles ("quantum dots"), organic luminescent materials, and the like, and combinations of them, can also be used. More generally the energy converting luminescent materials can be wavelength converting material and/or materials.

In a specific embodiment, the present packaged device includes an enclosure 117. The enclosure can be made of a suitable material such as an optically transparent plastic, glass, or other material. As also shown, the enclosure has a suitable shape 119. The shape can be annular, circular, egg-shaped, trapezoidal, or a combination of these shapes. Depending upon the embodiment, the enclosure with suitable shape and material is configured to facilitate and even optimize transmission of electromagnetic radiation from the LED device with coating through the surface region of the enclosure. FIGS. 2 through 5 illustrate a method of assembling the light emitting device of FIG. 1 according to an embodiment of the present invention. The method includes providing a substrate member 101 comprising a surface region. In a specific embodiment, the substrate is made of a suitable material such a metal including, but not limited to, Alloy 42, copper, dielectrics, plastics, or others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 101 is cupped. Alternatively, the surface region 101 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others.

In a specific embodiment, the method includes providing one or more light emitting diode devices overlying the surface region. At least one of the light emitting diode devices 103 is fabricated on a semipolar or nonpolar GaN containing substrate. In a specific embodiment, the device emits polarized electromagnetic radiation 105. As shown, the light emitting device is coupled to a first potential, which is attached to the substrate, and a second potential 109, which is coupled to wire or lead 111 bonded to a light emitting diode. The light emitting diode device comprises at least a blue LED device which emits substantially polarized emission blue light at a range from about 430 nanometers to about 490 nanometers.

In a specific embodiment, the LED device is attached onto the surface region of the substrate by silver paste, eutectic, gold eutectic, or other suitable techniques. In a preferred embodiment, the LED device is attached using die attach methods such as eutectic bonding of metals such as gold, silver, or platinum, among others.

Figures 2, 3, 4, 5:
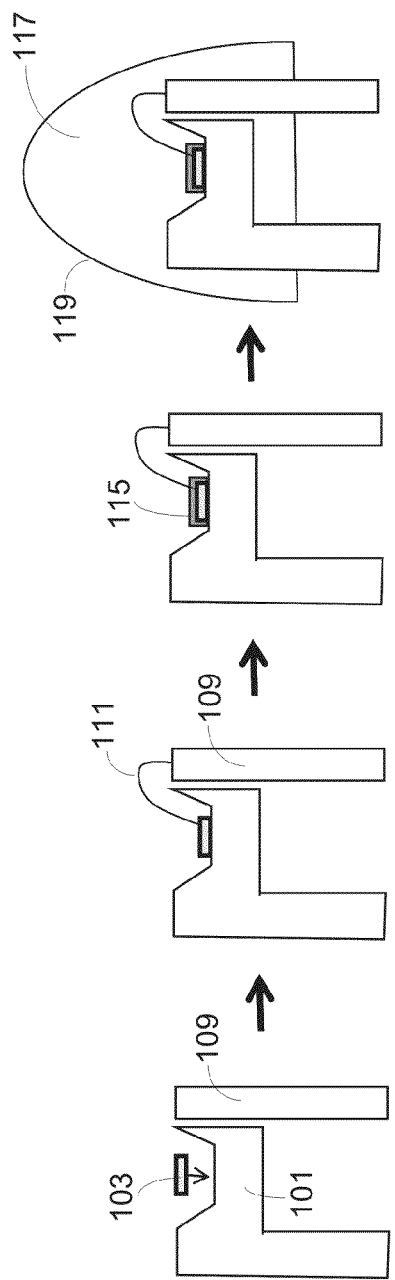
FIGS. 2 through 5 illustrate a simplified method of assembling the light emitting device of FIG. 1 according to an embodiment of the present invention.

Referring now to FIG. 3, the present method includes bonding wiring 115 from lead 109 to a bonding pad on the LED device. In a specific embodiment, the wire is a suitable material such as gold, aluminum, or others and is bonded using ultrasonic, megasonic, or techniques.

Referring now to FIG. 4, the method includes providing a thickness 115 of one or more entities formed overlying the light emitting diode devices. In a specific embodiment, the entities are excited by the substantially polarized emission and emit electromagnetic radiation of second wavelengths. In a preferred embodiment, the plurality of entities emit substantially yellow light from an interaction with the substantially polarized emission of blue light. In a specific embodiment, the thickness of the plurality of entities, which are phosphor entities, is about five microns or less.

In a specific embodiment, the entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}, Mn^{2+}$; $(Y,Lu)_2WO_6:Eu^{3+}, Mo^{6+}$; $(Ba,Sr,Ca)_3Mg_xSi_2O_8:Eu^{2+}, Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}, Mn^{2+}$; $Sb^{3+}$, $(Ba,Sr,Ca)MgAl_{10}O_{17}:Eu^{2+}, Mn^{2+}$; $(Ba,Sr,Ca)BPO_5:Eu^{2+}, Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}, Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}, Mn^{2+}$ (BAMn); $(Ba,Sr,Ca)Al_2O_4:Eu^{2+}$; $(Y,Gd,Lu,Sc,La)BO_3:Ce^{3+}, Tb^{3+}$; $Ca_8Mg(SiO_4)_4Cl_2:Eu^{2+}, Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}, Mn^{2+}$ (CASI); $Na_2Gd_2B_2O_7:Ce^{3+}, Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}, Mn^{2+}$; $(Y,Lu)_2WO_6:Eu^{3+}, Mo^{6+}$; $(Ba,Sr,Ca)_3Mg_xSi_2O_8:Eu^{2+}, Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the entities are coated onto the surface region of the LED device using a suitable technique. Such technique can include deposition, spraying, plating, coating, spin coating, electrophoretic deposition, sputtering, dipping, dispensing, sedimentation, ink jet printing, and screen printing. The deposition can use an electrostatic technique to provide for uniformity and a high quality coating. In a specific embodiment, the entities have a uniformity between about 10 percent and about 0.1 percent. In some embodiments, the entities are coated onto the surface region of the LED device prior to its separation from a wafer into discrete dies.

In a specific embodiment, the present method includes providing an enclosure 117 overlying the LED device, which has been mounted, bonded, and coated. The enclosure can be made of a suitable material such as an optically transparent plastic, glass, or other material. As also shown, the enclosure has a suitable shape 119. The shape can be annular, circular, egg-shaped, trapezoidal, or a combination of these shapes. Depending upon the embodiment, the enclosure is configured to facilitate and even optimize transmission of electromagnetic radiation from the LED device with coating through the surface region of the enclosure. FIG. 6 is a simplified diagram of an alternative packaged light emitting device 600 using multiple devices according to an embodiment of the present invention. In a specific embodiment, the present invention provides a packaged light emitting device 600 which has a substrate member with a surface region. In a specific embodiment, the substrate is made of a suitable material such a metal including, but not limited to, Alloy 42, copper, or others, including dielectrics and even plastics. In a specific embodiment, the substrate is generally from a lead frame member such as metal alloy.

The substrate, which holds the LED, can come in various shapes, sizes, and configurations. In a specific embodiment, the surface region of substrate 601 is cupped. Alternatively, the surface region 601 is recessed. The surface region generally has a smooth surface, plating, or coating. Such plating or coating can be gold, silver, platinum, aluminum, or any pure or alloy material, which is suitable for bonding to an overlying semiconductor material, but can be others.

Referring again to FIG. 6, the device has light emitting diode devices overlying the surface region. At least one of the light emitting diode devices 103 is fabricated on a semipolar or nonpolar GaN containing substrate. The device emits polarized electromagnetic radiation. As shown, the light emitting device is coupled to a first potential, which is attached to the substrate, and a second potential 610, which is coupled to wire or lead 611 bonded to a light emitting diode.

In a specific embodiment, at least one of the light emitting diode devices provides a quantum well region. The quantum well region is characterized by an electron wave function and a hole wave function which are substantially overlapped within a predetermined spatial region of the quantum well region according to a specific embodiment.

In a preferred embodiment, the light emitting diode device comprises at least a blue LED and the substantially polarized emission is blue light at a range from about 430 nanometers to about 490 nanometers.

The device has a thickness 115 of one or more which are excited by the substantially polarized emission and emit electromagnetic radiation at second wavelengths. In a preferred embodiment, the plurality of entities is emit substantially yellow light from an interaction with the substantially polarized emission of blue light. In a specific embodiment, the thickness of the plurality of entities, which are phosphor entities, is about five microns or less.

In a specific embodiment, the one or more entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO \cdot 0.5MgF_2 \cdot GeO_2:Mn_4+$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the light emitting diode device comprises at least a violet LED device capable of emitting electromagnetic radiation at a range from about 380 nanometers to about 440 nanometers, and the one or more entities are capable of emitting substantially white light. Other colored LEDs may also be used or combined according to a specific embodiment.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$, $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6 \cdot nB_2O_3:Eu^{2+}$; $2SrO \cdot 0.84P_2O_5 \cdot 0.16B_2O_3:Eu^{2+}$; $Sr_2Si_3O_8 \cdot 2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO \cdot 0.5MgF_2 \cdot GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes a second LED device 603 or possibly multiple devices. As shown, the second LED device is coupled to a first potential, which is attached to the substrate, and a second potential 609, which is coupled to wire or lead 111 bonded to the second LED device. The second LED device can be coated with a phosphor or remain uncoated 615. The LED device can be one of a plurality of colors including, but not limited to red, blue, green, yellow, violet, amber, cyan, and others emitting electromagnetic radiation, including ultraviolet. In a specific embodiment, the LED device can be made on a polar, non-polar, or semi-polar gallium nitride containing material. Alternatively, the LED can be made on an AlInGaP or like material.

In other embodiments, the packaged device can include other types of optical and/or electronic devices. As an example, the optical devices can be an organic light emitting diode (OLED), a laser diode, a nanoparticle optical device, or others. The electronic device can include an integrated circuit, a transistor, a rectifier, a sensor, a micro-machined electronic mechanical system, or any combination of these, and the like.

In a specific embodiment, the present packaged device includes an enclosure 617. The enclosure can be made of a suitable material such as an optically transparent plastic, glass, or other material. As also shown, the enclosure has a suitable shape 619 which can be annular, circular, egg-shaped, trapezoidal, or a combination of these. Depending upon the embodiment, the enclosure is configured to facilitate, and even optimize transmission of electromagnetic radiation from the LED device with coating through the surface region of the enclosure FIGS. 7 through 10 illustrate a simplified method of assembling the light emitting device of FIG. 6 according to an embodiment of the present invention.

FIG. 11 is a simplified diagram of another alternative packaged light emitting device using an optical path to a plane region according to an embodiment of the present invention. As shown, the device has a substrate made of a suitable material such a metal including, but not limited to, Alloy 42, copper, dielectrics or plastics, among others. In a specific embodiment, the substrate is generally from a lead frame member such as a metal alloy, but can be others.

The substrate, which holds the LED, can come in various shapes, sizes, and configurations. In a specific embodiment, the surface region of substrate 1101 is cupped. Alternatively, the surface region 1101 is recessed. The surface region is generally a smooth surface, plating, or coating. Such plating or coating can be gold, silver, platinum, aluminum, or any pure or alloy material, which is suitable for bonding to an overlying semiconductor material, but can be others.

Referring again to FIG. 11, the device has light emitting diode devices overlying the surface region. At least one of the light emitting diode devices 1103 is fabricated on a semipolar or nonpolar GaN containing substrate and emits polarized electromagnetic radiation 1105. As shown, the light emitting device is coupled to a first potential, which is attached to the substrate, and a second potential 1109, which is coupled to wire or lead 1111. One of the light emitting diode devices includes a quantum well region characterized by an electron wave function and a hole wave function which are substantially overlapped within a predetermined spatial region of the quantum well region.

In a preferred embodiment, the light emitting diode device include at least a blue LED device which emits polarized blue light at a range from about 430 nanometers to about 490 nanometers.

The packaged device includes an enclosure 1117 made of a suitable material such as an optically transparent plastic, glass, or other material. The enclosure has a suitable shape 1119 which can be annular, circular, egg-shaped, trapezoidal, or a combination of these. Depending upon the embodiment, the enclosure with suitable shape and material is configured to facilitate and even optimize transmission of electromagnetic radiation from the LED device through the surface region of the enclosure. The enclosure includes an interior region and an exterior region with a volume defined within the interior region. The volume is open and filled with an inert gas or air to provide an optical path between the LED device or devices and the surface region of the enclosure.

In a specific embodiment, the present packaged device also has a thickness 1115 of entities formed overlying the enclosure to interact with light from the light emitting diode devices. In a specific embodiment, the entities are excited by the substantially polarized emission and emit electromagnetic radiation of second wavelengths. In a preferred embodiment, the plurality of entities is capable of emitting substantially yellow light from an interaction with the substantially polarized emission of blue light. In a specific embodiment, the thickness of phosphor entities is about five microns or less.

In a specific embodiment, entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$: where $0.05 \le x \le 0.5$, $0 \le y \le 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \le 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \le x \le 1.0$, $0.01 \le y \le 1.0$; $(SrCa)_{1-x}Eu_xSi_5N_8$, where $0.01 \le x \le 0.3$; $SrZnO_2:Sm^{+3}$; $M_mO_nX$ wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^3$ activated phosphate or borate phosphors; and mixtures thereof.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}, Mn^{2+}$; $Sb^{3+}$, $(Ba,Sr,Ca)MgAl_{10}O_{17}:Eu^{2+}, Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+}, Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}, Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \le x \le 0.5$, $0 \le y \le 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$; $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \le 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \le x \le 1.0$, $0.01 \le y \le 1.0$; $(SrCa)_{1-x}Eu_xSi_5N_8$, where $0.01 \le x \le 0.3$; $SrZnO_2:Sm^{+3}$; $M_mO_nX$, wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^{3+}$ activated phosphate or borate phosphors; and mixtures thereof.

FIGS. 12 through 15 illustrate a simplified method of assembling the light emitting device of FIG. 11 according to an embodiment of the present invention.

FIG. 16 is a simplified diagram of a yet an alternative packaged light emitting device 1600 using an optical path to a plane region and filler material according to an embodiment of the present invention. The invention provides a packaged light emitting device 1600 with a substrate member having a surface region. In a specific embodiment, the substrate is made of a suitable material such a metal including, but not limited to, Alloy 42, copper, dielectric, or even plastic, among others, and preferably is a lead frame member such as a metal alloy.

The substrate, which holds the LED, can come in various shapes, sizes, and configurations and can be cupped or recessed. Additionally, the surface region is generally a smooth surface, with plating or coating. Such plating or coating can be gold, silver, platinum, or any pure or alloy material, which is suitable for bonding to an overlying semiconductor material, but can be others.

Referring again to FIG. 1, the device has one or more light emitting diode devices overlying the surface region. Each light emitting diode device 1603 is fabricated on a semipolar or nonpolar GaN containing substrate and emits polarized electromagnetic radiation. As shown, the light emitting device is coupled to a first potential, which is attached to the substrate, and a second potential 1609, which is coupled to wire or lead 1611 bonded to a light emitting diode. At least one of the light emitting diode devices includes a quantum well region characterized by an electron wave function and a hole wave function. The electron wave function and the hole wave function are substantially overlapped within a predetermined spatial region of the quantum well. In a preferred embodiment, the one or more light emitting diode device comprises at least a blue LED device emitting substantially polarized blue light at a range from about 480 nanometers to about 570 nanometers.

In a specific embodiment, the present device also has a thickness 1615 of one or more entities formed overlying the light emitting diode devices and within an interior region of enclosure 1617, which will be described in more detail below. The entities are excited by the substantially polarized emission and emit electromagnetic radiation of second wavelengths. In a preferred embodiment, the plurality of entities emits substantially yellow light from an interaction with the blue light. The phosphor is about five microns or less thick In a specific embodiment, entities comprises a phosphor or phosphor blend selected from $(Y,Gd,Tb,Sc,Lu,La)_3(Al,Ga,In)_5O_{12}:Ce^{3+}$, $SrGa_2S_4:Eu^{2+}$, $SrS:Eu^2$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the light emitting diode device comprises at least a violet LED device capable of emitting electromagnetic radiation at a range from about 380 nanometers to about 440 nanometers and the entities are capable of emitting substantially white light, the substantially polarized emission being violet light. Other colored LEDs may also be used or combined according to a specific embodiment.

In a specific embodiment, the entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$, $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^3$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^3$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes an enclosure 1617. The enclosure can be made of a suitable material such as an optically transparent plastic, glass, or other material. As also shown, the enclosure has a suitable shape 1619 which can be annular, circular, egg-shaped, trapezoidal, or a combination of these shapes. Depending upon the embodiment, the enclosure with suitable shape and material is configured to facilitate and even optimize transmission of electromagnetic radiation from the LED device through the surface region of the enclosure. In a specific embodiment, the enclosure comprises an interior region and an exterior region with a volume defined within the interior region. The volume is open and filled with an inert gas or air to provide an optical path between the LED device or devices and the surface region of the enclosure. In a specific embodiment, the enclosure also has a thickness and fits around a base region of the substrate.

In a specific embodiment, the plurality of entities is suspended in a suitable medium. An example of such a medium can be a silicone, glass, spin on glass, plastic, polymer, which is doped, metal, or semiconductor material, including layered materials, and/or composites, among others. Depending upon the embodiment, the medium including polymers begins as a fluidic state, which fills an interior region of the enclosure. The medium fills and can seal the LED device or devices. The medium is then cured and fills in a substantially stable state. The medium is preferably optically transparent, but can also be selectively transparent and/or translucent. In addition, the medium, once cured, is substantially inert. In a preferred embodiment, the medium has a low absorption capability to allow a substantial portion of the electromagnetic radiation generated by the LED device to traverse through the medium and be outputted through the enclosure. In other embodiments, the medium can be doped or treated to selectively filter, disperse, or influence selected wavelengths of light. As an example, the medium can be treated with metals, metal oxides, dielectrics, or semiconductor materials, and/or combinations of these materials, and the like.

FIGS. 17 through 20 illustrate a simplified method of assembling the light emitting device of FIG. 16 according to an embodiment of the present invention.

Figure 21:
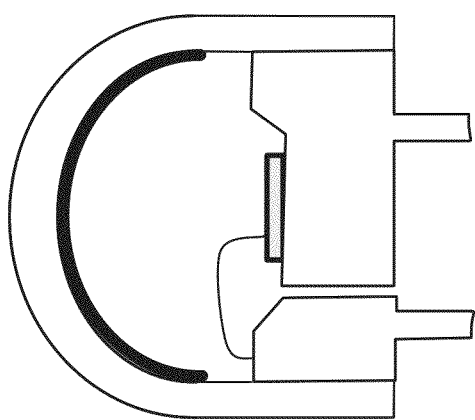
FIG. 21 is a simplified diagram of a yet an alternative packaged light emitting device using an optical path to a plane region according to an embodiment of the present invention.

FIG. 21 is a simplified diagram of a yet an alternative packaged light emitting device using an optical path to a plane region according to an embodiment of the present invention. As shown, the packaged light emitting device includes one or more entities formed within an interior region of enclosure 2117.

Figure 22:
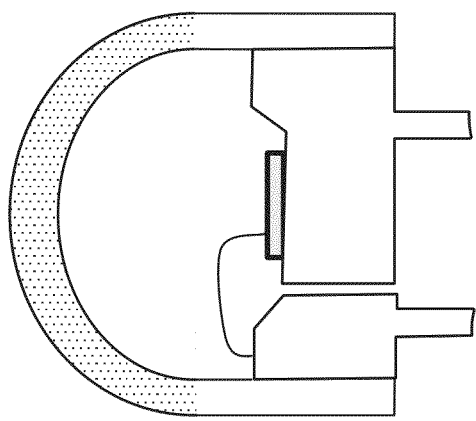
FIG. 22 is a simplified diagram of a yet an alternative packaged light emitting device using an optical path to a plane region according to an embodiment of the present invention.

FIG. 22 is a simplified diagram of a yet an alternative packaged light emitting device using an optical path to a plane region according to an embodiment of the present invention The packaged light emitting device includes entities formed within a thickness of enclosure 2217.

Although the above has been described in terms of an embodiment of a specific package, there can be many variations, alternatives, and modifications. As an example, the LED device can be configured in a variety of packages such as cylindrical, surface mount, power, lamp, flip-chip, star, array, strip, or geometries that rely on lenses (silicone, glass) or sub-mounts (ceramic, silicon, metal, composite). Alternatively, the package can be any variations of these packages.

In other embodiments, the packaged device can include other types of optical and/or electronic devices. As an example, the optical devices can be OLED, a laser, a nano-particle optical device, and others. In other embodiments, the electronic device can include an integrated circuit, a sensor, a micro-machined electronic mechanical system, or any combination of these, and the like.

In a specific embodiment, the packaged device can be coupled to a rectifier to convert alternating current power to direct current, which is suitable for the packaged device. The rectifier can be coupled to a suitable base, such as an Edison screw such as E27 or E14, bipin base such as MR16 or GU5.3, or a bayonet mount such as GU10, or others. In other embodiments, the rectifier can be spatially separated from the packaged device.

Additionally, the present packaged device can be provided in a variety of applications. In a preferred embodiment, the application is general lighting, which includes buildings for offices, housing, outdoor lighting, stadium lighting, and others. Alternatively, the applications can be for display, such as those used for computing applications, televisions, flat panels, micro-displays, and others. Still further, the applications can include automotive, gaming, and others.

In a specific embodiment, the present devices are configured to achieve spatial uniformity. That is, diffusers can be added to the encapsulant to achieve spatial uniformity. Depending upon the embodiment, the diffusers can include $TiO_2$, $CaF_2$, $SiO_2$, $CaCO_3$, $BaSO_4$, and others, which are optically transparent and have a different index than the encapsulant causing the light to reflect, refract, and scatter to make the far field pattern more uniform. Of course, there can be other variations, modifications, and alternatives.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

While the above is a full description of the specific embodiments, various modifications, alternative constructions and equivalents may be used. Additionally, the above has been generally described in terms of entities that may be phosphor materials or phosphor like materials, but it would be recognized that other "energy-converting luminescent materials," which may include one or more phosphors, semiconductors, semiconductor nanoparticles ("quantum dots"), organic luminescent materials, and the like, and combinations of them, can also be used. The energy converting luminescent materials can generally be wavelength converting material and/or materials or thicknesses of them. Furthermore, the above has been generally described in electromagnetic radiation that directly emits and interacts with the wavelength conversion materials, but it would be recognized that the electromagnetic radiation can be reflected and then interact with the wavelength conversion materials or a combination of reflection and direct incident radiation. The specification describes specific gallium and nitrogen containing surface orientations, but it would be recognized that other plane orientations can be used. Therefore, the above description and illustrations should not be taken as limiting the scope of the present invention which is defined by the appended claims.

The invention claimed is:

1. A method for fabricating a light emitting diode device comprising:
providing a substrate member comprising a first surface region;
providing one or more light emitting diode devices overlying the first surface region, at least one of the light emitting diode devices being fabricated on a semipolar or nonpolar GaN containing device substrate, the device substrate comprising a bulk gallium nitride substrate, the at least one or more light emitting diode devices fabricated on the semipolar or nonpolar GaN containing device substrate emitting substantially polarized emission of one or more first wavelengths;
coupling an optically transparent member to the one or more light emitting diode devices such that an optical path is provided between the one or more light emitting diode devices and the optically transparent member; and
forming a thickness of one or more entities formed within a vicinity of the optically transparent member, one or more of the entities being excited by the substantially polarized emission to emit electromagnetic radiation at one or more second wavelengths;
wherein the bulk gallium nitride substrate has a dislocation density in the plane of the large-area surface that is less than $5 \times 10^6$ $cm^{-2}$.

2. The method of claim 1, wherein at least one of the light emitting diode devices comprises a quantum well region, the quantum well region being characterized by an electron wave function and a hole wave function, the electron wave function and the hole wave function being substantially overlapped within a predetermined spatial region of the quantum well region.

3. The method of claim 1, wherein the thickness of the one or more entities is formed overlying a first side of the optically transparent member, the first side facing the one or more of the light emitting diode devices.

4. The method of claim 1, wherein the one or more light emitting diode devices comprise at least a blue LED device, the substantially polarized emission being blue light.

5. The method of claim 1, wherein the one or more light emitting diode devices comprise at least a blue LED device capable of emitting electromagnetic radiation at a wavelength range from about 430 nanometers to about 490 nanometers, the substantially polarized emission being blue light.

6. The method of claim 1, wherein the one or more light emitting diode devices comprise at least a blue LED device capable of emitting electromagnetic radiation at a range from about 430 nanometers to about 490 nanometers and the one or more entities is capable of emitting substantially yellow light, the substantially polarized emission being blue light.

7. The method of claim 6, wherein the one or more entities comprises a phosphor or phosphor blend selected from one or more of (Y, Gd, Tb, Sc, Lu, La)$_3$(Al, Ga, In)$_5$O$_{12}$:Ce$^{3+}$, SrGa$_2$S$_4$:Eu$^{2+}$, SrS:Eu$^{2+}$, and colloidal quantum dot thin films comprising CdTe, ZnS, ZnSe, ZnTe, CdSe, or CdTe.

8. The method of claim 6, further comprising a phosphor capable of emitting substantially red light, wherein the phosphor is selected from one or more of the group consisting of (Gd,Y,Lu,La)$_2$O$_3$:Eu$^{3+}$, Bi$^{3+}$; (Gd,Y,Lu,La)$_2$O$_2$S:Eu$^{3+}$, Bi$^{3+}$; (Gd,Y,Lu,La)VO$_4$:Eu$^{3+}$, Bi$^{3+}$; Y$_2$(O,S)$_3$: Eu$^{3+}$; Ca$_{1-x}$ $Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x\leq2$; $(RE_{1-y}Ce_y)Mg_{2-x}Li_xSi_{3-x}PxO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5\leq x.\leq1.0$, $0.01\leq y\leq1.0$; $(SrCa)_{1-x}Eu_xSi_5N_8$, where $0.01\leq x\leq 0.3$; $SrZnO_2:Sm^{+3}$; $M_mO_nX$, wherein M is selected from the group of Sc, Y, a lanthanide, an alkali earth metal and mixtures thereof; X is a halogen; $1\leq m\leq 3$; and $1\leq n\leq 4$, and wherein the lanthanide doping level can range from 0.1 to 40% spectral weight; and $Eu^{3+}$ activated phosphate or borate phosphors; and mixtures thereof.

9. The method of claim 1, wherein the one or more light emitting diode devices comprise at least a violet LED device capable of emitting electromagnetic radiation at a range from about 380 nanometers to about 440 nanometers and the one or more entities are capable of emitting substantially white light, the substantially polarized emission being violet light.

10. The method of claim 1, wherein the one or more entities comprise a blend of wavelength converting materials capable of emitting substantially blue light, substantially green light, and substantially red light.

11. The method of claim 10, wherein the wavelength converting material capable of emitting substantially blue light comprises a blue phosphor selected from the group consisting of $(Ba,Sr,Ca)_5(PO_4)_3(Cl,F,Br,OH):Eu^{2+}$, $Mn^{2+}$; $Sb^{3+}$, $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof.

12. The method of claim 10, wherein the wavelength converting material capable of emitting substantially green light comprises a green phosphor selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof.

13. The method of claim 10, wherein the wavelength converting material capable of emitting substantially red light comprises a red phosphor selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3: Eu^{3+}$; $Ca_{1-x}Mo_{1-y}SiO_4$; where $0.05\leq x\leq 0.5$, $0\leq y\leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x\leq2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5\leq x.\leq1.0$, $0.01\leq y\leq1.0$; $(SrCa)_{1-x}Eu_xSi_5N_8$, where $0.01\leq x\leq 0.3$; $SrZnO_2:Sm^{+3}$; $M_mO_nX$, wherein M is selected from the group of Sc, Y, a lanthanide, an alkali earth metal and mixtures thereof; X is a halogen; $1\leq m\leq 3$; and $1\leq n\leq 4$, and wherein the lanthanide doping level can range from 0.1 to 40% spectral weight; and $Eu^{3+}$ activated phosphate or borate phosphors; and mixtures thereof.

14. The method of claim 1, wherein the one or more entities is a plurality of wavelength converting entities selected from a red emitting wavelength converting material, a green emitting wavelength converting material, a blue emitting wavelength converting material, and a yellow emitting wavelength converting material.

15. The method of claim 1, wherein the thickness of the one or more entities is provided by at least one of electrophoretic deposition, plating, sputtering, spraying, dipping, and dispensing.

16. The method of claim 1, wherein the one or more light emitting diode devices comprise two light emitting devices.

17. The method of claim 1, wherein the bulk gallium nitride substrate was formed by slicing from a boule that was grown by hydride vapor epitaxy or ammonothermally.

18. The method of claim 1, wherein the thickness of the one or more entities is formed overlying the one or more light emitting diode devices.

19. The method of claim 1, further comprising an enclosure, wherein the enclosure has a shape chosen from among annular, circular, egg-shaped, trapezoidal, or a combination thereof.

20. The method of claim 1, wherein the device is packaged and is coupled to a rectifier.

21. The method of claim 1, further comprising a diffuser optically coupled to the one or more light emitting diode devices, the diffuser comprising at least one of $TiO_2$, $CaF_2$, $SiO_2$, $CaCO_3$, and $BaSO_4$.

22. A method for manufacturing a light emitting device comprising:
providing a substrate member having a first surface;
providing at least one light emitting diode overlying the first surface emitting a substantially polarized emission of first wavelengths, the at least one light emitting diode comprising a device substrate comprising a semipolar or nonpolar bulk gallium nitride substrate;
coupling an optically transparent member to the at least one light emitting diode such that an optical path is formed between the at least one light emitting diode and the optically transparent member; and
forming a blend of phosphors coupled to the optical transparent member, the blend of phosphors configured to be excited by the substantially polarized emission of first wavelengths to thereby emit electromagnetic radiation at second wavelengths;
wherein the substantially polarized emission of first wavelengths comprises blue light and the blend of phosphors emits electromagnetic radiation at second wavelengths comprising yellow and red.

23. A method of using a light emitting device comprising:
providing a substrate member having a first surface, at least one light emitting diode overlying the first surface emitting a substantially polarized emission of first wavelengths, the at least one light emitting diode comprising a device substrate comprising a semipolar or nonpolar bulk gallium nitride substrate, an optically transparent member coupled to the at least one light emitting diode, an optical path between the at least one light emitting diode and the optically transparent member; and a blend of phosphors optically coupled to the at least one light emitting diode; and
subjecting the blend of phosphors to the substantially polarized emission of first wavelengths to thereby emit electromagnetic radiation at second wavelengths;
wherein the substantially polarized emission of first wavelengths comprises violet light and the blend of phosphors emits electromagnetic radiation at second wavelengths comprising blue, green, and red.

24. A method for using a light emitting device comprising:
providing a substrate member having a first surface, at least one light emitting diode overlying the first surface emitting a substantially polarized emission of first wavelengths, the at least one light emitting diode comprising a device substrate comprising a semipolar or nonpolar bulk gallium nitride substrate, an optically transparent member coupled to the at least one light emitting diode, an optical path between the at least one light emitting diode and the optically transparent member; and a blend of phosphors optically coupled to the at least one light emitting diode; and
subjecting the blend of phosphors to the substantially polarized emission of first wavelengths to thereby emit electromagnetic radiation at second wavelengths;
wherein the substantially polarized emission of first wavelengths comprises blue light and the blend of phosphors emits electromagnetic radiation at second wavelengths comprising green and red.

25. A method of fabricating a light emitting device comprising:
providing a substrate member comprising a first surface region;
providing one or more light emitting diode devices overlying the first surface region, at least one of the light emitting diode devices being fabricated on a semipolar or nonpolar GaN containing device substrate, the device substrate comprising a bulk gallium nitride substrate, the at least one or more light emitting diode devices fabricated on the semipolar or nonpolar GaN containing device substrate emitting substantially polarized emission of one or more first wavelengths; and
coupling an optically transparent member to the one or more light emitting diode devices such that an optical path is provided between the one or more light emitting diode devices and the optically transparent member and such that a thickness of one or more entities is formed within a vicinity of the optically transparent member, one or more of the entities being excited by the substantially polarized emission to emit electromagnetic radiation at one or more second wavelengths;
wherein a crystallographic orientation of the device substrate is within ±5 degrees of the $\{1 -1\ 0\ 0\}$ m plane, the $\{1\ 1 -2\ 0\}$ a plane, the $\{1\ 1 -2\ 2\}$ plane, the $\{2\ 0 -2\pm1\}$ plane, the $\{1 -1\ 0\pm1\}$ plane, the $\{1 -1\ 0 -\pm2\}$ plane, or the $\{1 -1\ 0\pm3\}$ plane.

26. The method of claim 25, wherein at least one of the light emitting diode devices comprises a quantum well region, the quantum well region being characterized by an electron wave function and a hole wave function, the electron wave function and the hole wave function being substantially overlapped within a predetermined spatial region of the quantum well region.

27. The method of claim 25, wherein the thickness of the one or more entities is formed overlying a first side of the optically transparent member, the first side facing the one or more of the light emitting diode devices.

28. The method of claim 25, wherein the one or more light emitting diode devices comprise at least a blue LED device, the substantially polarized emission being blue light.

29. The method of claim 25, wherein the one or more light emitting diode devices comprise at least a blue LED device capable of emitting electromagnetic radiation at a wavelength range from about 430 nanometers to about 490 nanometers, the substantially polarized emission being blue light.

30. The method of claim 25, wherein the one or more light emitting diode devices comprise at least a blue LED device capable of emitting electromagnetic radiation at a range from about 430 nanometers to about 490 nanometers and the one or more entities is capable of emitting substantially yellow light, the substantially polarized emission being blue light.

31. The method of claim 30, wherein the one or more entities comprises a phosphor or phosphor blend selected from one or more of $(Y, Gd, Tb, Sc, Lu, La)_3(Al, Ga, In)_5O_{12}$:$Ce^{3+}$, $SrGa_2S_4$:$Eu^{2+}$, $SrS$:$Eu^{2+}$, and colloidal quantum dot thin films comprising CdTe, ZnS, ZnSe, ZnTe, CdSe, or CdTe.

32. The method of claim 30, further comprising a phosphor capable of emitting substantially red light, wherein the phosphor is selected from one or more of the group consisting of $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd,Y,Lu,La)VO_4$:$Eu^{3+}$, $Bi^{3+}$; $Y_2(O,S)_3$: $Eu^{3+}$; $Ca_{1-x}Mo_{1-y}Si_yO_4$: where $0.05 \le x \le 0.5$, $0 \le y \le 0.1$; $(Li,Na,K)_5Eu(W,Mo)O_4$; $(Ca,Sr)S$:$Eu^{2+}$; $SrY_2S_4$:$Eu^{2+}$; $CaLa_2S_4$:$Ce^{3+}$; $(Ca,Sr)S$:$Eu^{2+}$; $3.5MgO*0.5MgF_2*GeO_2$:$Mn^{4+}$ (MFG); $(Ba,Sr,Ca)Mg_xP_2O_7$:$Eu^{2+}$, $Mn^{2+}$; $(Y,Lu)_2WO_6$:$Eu^{3+}$, $Mo^{6+}$; $(Ba,Sr,Ca)_3Mg_xSi_2O_8$:$Eu^{2+}$, $Mn^{2+}$, wherein $1<x \le 2$; $(RE_{1-y}Ce_y)Mg_{2-x}Li_xSi_{3-x}PxO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \le x. \le 1.0$, $0.01 \le y \le 1.0$; $(SrCa)_{1-x}Eu_xSi_5N_8$, where $0.01 \le x \le 0.3$; $SrZnO_2$:$Sm^{+3}$; $M_mO_nX$, wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^{3+}$ activated phosphate or borate phosphors; and mixtures thereof.

33. The method of claim 25, wherein the one or more light emitting diode devices comprise at least a violet LED device capable of emitting electromagnetic radiation at a range from about 380 nanometers to about 440 nanometers and the one or more entities are capable of emitting substantially white light, the substantially polarized emission being violet light.

34. The method of claim 25, wherein the one or more entities comprise a blend of wavelength converting materials capable of emitting substantially blue light, substantially green light, and substantially red light.

35. The method of claim 34, wherein the wavelength converting material capable of emitting substantially blue light comprises a blue phosphor selected from the group consisting of $(Ba,Sr,Ca)_5(PO_4)_3(Cl,F,Br,OH)$:$Eu^{2+}$, $Mn^{2+}$; $Sb^{3+}$, $(Ba,Sr,Ca)MgAl_{10}O_{17}$:$Eu^{2+}$, $Mn^{2+}$; $(Ba,Sr,Ca)BPO_5$:$Eu^{2+}$, $Mn^{2+}$; $(Sr,Ca)_{10}(PO_4)_6*nB_2O_3$:$Eu^{2+}$; $2SrO*0.84P_2O5*0.16B_2O_3$:$Eu^{2+}$; $Sr_2Si_3O_8*2SrCl_2$:$Eu^{2+}$; $(Ba,Sr,Ca)Mg_xP_2O_7$:$Eu^{2+}$, $Mn^{2+}$; $Sr_4Al_{14}O_{25}$:$Eu^{2+}$ (SAE); $BaAl_8O_{13}$:$Eu^{2+}$; and mixtures thereof.

36. The method of claim 34, wherein the wavelength converting material capable of emitting substantially green light comprises a green phosphor selected from the group consisting of $(Ba,Sr,Ca)MgAl_{10}O_{17}$:$Eu^{2+}$, $Mn^{2+}$ (BAMn); $(Ba,Sr,Ca)Al_2O_4$:$Eu^{2+}$; $(Y,Gd,Lu,Sc,La)BO_3$:$Ce^{3+}$,$Tb^{3+}$; $Ca_8Mg(SiO_4)_4Cl_2$:$Eu^{2+}$, $Mn^{2+}$; $(Ba,Sr,Ca)_2SiO_4$:$Eu^{2+}$; $(Ba,Sr,Ca)_2(Mg,Zn)Si_2O_7$:$Eu^{2+}$; $(Sr,Ca,Ba)(Al,Ga,In)_2S_4$:$Eu^{2+}$; $(Y,Gd,Tb,La,Sm,Pr,Lu)_3(Al,Ga)_5O_{12}$:$Ce^{3+}$; $(Ca,Sr)_8(Mg,Zn)(SiO_4)_4Cl_2$:$Eu^{2+}$, $Mn^{2+}$ (CASI); $Na_2Gd_2B_2O_7$:$Ce^{3+}$, $Tb^{3+}$; $(Ba,Sr)_2(Ca,Mg,Zn)B_2O_6$:K,Ce,Tb; and mixtures thereof.

37. The method of claim 34, wherein the wavelength converting material capable of emitting substantially red light comprises a red phosphor selected from the group consisting of $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd,Y,Lu,La)VO_4$:$Eu^{3+}$, $Bi^{3+}$; $Y_2(O,S)_3$: $Eu^{3+}$; $Ca_{1-x}Mo_{1-y}Si_yO_4$: where $0.05 \le x \le 0.5$, $0 \le y \le 0.1$; $(Li,Na,K)_5Eu(W,Mo)O_4$; $(Ca,Sr)S$:$Eu^{2+}$; $SrY_2S_4$:$Eu^{2+}$; $CaLa_2S_4$:$Ce^{3+}$; $(Ca,Sr)S$:$Eu^{2+}$; $3.5MgO*0.5MgF_2*GeO_2$:$Mn^{4+}$ (MFG); $(Ba,Sr,Ca)$ $Mg_xP_2O_7$:$Eu^{2+}$, $Mn^{2+}$; $(Y,Lu)_2WO_6$:$Eu^{3+}$, $Mo^{6+}$; $(Ba, Sr,Ca)_3Mg_xSi_2O_8$:$Eu^{2+}$, $Mn^{2+}$, wherein $1<x\leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5\leq x.\leq 1.0$, $0.01\leq y\leq 1.0$; $(SrCa)_{1-x}Eu_xSi_5N_8$, where $0.01\leq x\leq 0.3$; $SrZnO_2$:$Sm^{+3}$; $M_mO_nX$, wherein M is selected from the group of Sc, Y, a lanthanide, an alkali earth metal and mixtures thereof; X is a halogen; $1\leq m\leq 3$; and $1\leq n\leq 4$, and wherein the lanthanide doping level can range from 0.1 to 40% spectral weight; and $Eu^{3+}$ activated phosphate or borate phosphors; and mixtures thereof.

38. The method of claim 25, wherein the one or more entities is a plurality of wavelength converting entities selected from a red emitting wavelength converting material, a green emitting wavelength converting material, a blue emitting wavelength converting material, and a yellow emitting wavelength converting material.

39. The method of claim 25, wherein the thickness of the one or more entities is provided by at least one of electrophoretic deposition, plating, sputtering, spraying, dipping, and dispensing.

40. The method of claim 25, wherein the one or more light emitting diode devices comprise two light emitting devices.

41. The method of claim 25, wherein the bulk gallium nitride substrate was formed by slicing from a boule that was grown by hydride vapor epitaxy or ammonothermally.

42. The method of claim 25, wherein the thickness of the one or more entities is formed overlying the one or more light emitting diode devices.

43. The method of claim 25, further comprising an enclosure, wherein the enclosure has a shape chosen from among annular, circular, egg-shaped, trapezoidal, or a combination thereof.

44. The method of claim 25, wherein the light emitting device is packaged and is coupled to a rectifier.

45. The method of claim 25, further comprising a diffuser optically coupled to the one or more light emitting diode devices, the diffuser comprising at least one of $TiO_2$, $CaF_2$, $SiO_2$, $CaCO_3$, and $BaSO_4$.

* * * * *